US012577431B2

(12) United States Patent  (10) Patent No.: US 12,577,431 B2
Goto et al.  (45) Date of Patent: Mar. 17, 2026

(54) DISPERSANT AND POLISHING AGENT COMPOSITION

(71) Applicant: TOAGOSEI CO., LTD., Tokyo (JP)

(72) Inventors: Akihiro Goto, Aichi (JP); Sachiko Imura, Aichi (JP); Shun Nakano, Aichi (JP); Ryutaro Tsubouchi, Aichi (JP)

(73) Assignee: TOAGOSEI CO., LTD., Tokyo (JP)

( * ) Notice: Subject to any disclaimer, the term of this patent is extended or adjusted under 35 U.S.C. 154(b) by 571 days.

(21) Appl. No.: 17/830,285

(22) Filed: Jun. 1, 2022

(65) Prior Publication Data

US 2022/0290008 A1  Sep. 15, 2022

Related U.S. Application Data

(63) Continuation of application No. PCT/JP2020/036577, filed on Sep. 28, 2020.

(30) Foreign Application Priority Data

Dec. 27, 2019  (JP) ................................. 2019-239687
Dec. 27, 2019  (JP) ................................. 2019-239688
Dec. 27, 2019  (JP) ................................. 2019-239689

(51) Int. Cl.
*C09G 1/02* (2006.01)
*C08L 53/00* (2006.01)
*C09K 23/22* (2022.01)
*H01L 21/321* (2006.01)

(52) U.S. Cl.
CPC ................ *C09G 1/02* (2013.01); *C08L 53/00* (2013.01); *C09K 23/22* (2022.01); *H01L 21/3212* (2013.01)

(58) Field of Classification Search
None
See application file for complete search history.

(56) References Cited

U.S. PATENT DOCUMENTS

| | | | |
|---|---|---|---|
| 2010/0081281 A1 | 4/2010 | Babu et al. | |
| 2013/0122705 A1* | 5/2013 | Babu ................. | H01L 21/30625 |
| | | | 438/693 |
| 2015/0079789 A1 | 3/2015 | Mori et al. | |
| 2016/0001416 A1* | 1/2016 | Tsuchiya ........... | H01L 21/30625 |
| | | | 252/79.1 |
| 2019/0100677 A1* | 4/2019 | Cui ..................... | H01L 21/3212 |
| 2019/0136089 A1* | 5/2019 | Otsuki ................ | H01L 21/3212 |
| 2020/0010727 A1* | 1/2020 | Tsuchiya ........... | H01L 21/02024 |

FOREIGN PATENT DOCUMENTS

| | | |
|---|---|---|
| CN | 102165564 A | 8/2011 |
| CN | 106471090 A | 3/2017 |
| CN | 107267118 A | 10/2017 |
| JP | 2006-303348 A | 11/2006 |
| JP | 2009-070908 A | 4/2009 |
| JP | 2012-503880 A | 2/2012 |
| JP | 2015-151509 A | 8/2015 |
| JP | 2017-017177 A | 1/2017 |
| JP | 2017-183297 A | 10/2017 |
| KR | 10-2011-0076969 A | 7/2011 |
| WO | 2013/137212 A1 | 9/2013 |
| WO | 2019/177802 A1 | 9/2019 |
| WO | 2019/208386 A1 | 10/2019 |

OTHER PUBLICATIONS

Pubchem, N-Methylmethacrylamide via https://pubchem.ncbi.nlm.nih.gov/compound/N-Methylmethacrylamide ; pp. 1-25 (Year: 2024).*
Wikipedia, "N-vinylpyrrolidone" via https://en.wikipedia.org/wiki/N-Vinylpyrrolidone ; pp. 1-2 (Year: 2024).*
Wikipedia, "Acrylamide" via https://en.wikipedia.org/wiki/Acrylamide (Year: 2025).*
Wikipedia, "Methacrylamide" via https://en.wikipedia.org/wiki/Methacrylamide (Year: 2025).*
Wikipedia, "2-Acrylamido-2-methylpropane sulfonic acid" via https://en.wikipedia.org/wiki/2-Acrylamido-2-methylpropane_sulfonic_acid ; pp. 1-7 (Year: 2025).*
Wikipedia, "Acrylic acid" via https://en.wikipedia.org/wiki/Acrylic_acid ; pp. 1-7 (Year: 2025).*
Wikipedia, "Maleic acid" via https://en.wikipedia.org/wiki/Maleic_acid ; pp. 1-5 (Year: 2025).*
Office Action issued in counterpart Taiwanese Patent Application No. TW 109134626 dated Feb. 9, 2022, with translation (15 pages).
International Search Report issued in corresponding International Application No. PCT/JP2020/036577 mailed Nov. 2, 2020, with translation (5 pages).
Written Opinion issued in corresponding International Application No. PCT/JP2020/036577 mailed Nov. 2, 2020 (4 pages).
Notice of Reasons for Revocation issued in corresponding Japanese Patent No. 7255711 mailed Feb. 8, 2024, with English translation (62 pages).
International Preliminary Report on Patentability issued in corresponding International Application No. PCT/JP2020/036577 mailed Jul. 7, 2022 (12 pages).
Office Action issued in corresponding Chinese Patent Application No. 202080069040.5, dated Feb. 25, 2025, with translation (24 pages).

(Continued)

*Primary Examiner* — Binh X Tran

(74) *Attorney, Agent, or Firm* — Osha Bergman Watanabe & Burton LLP

(57) ABSTRACT

A dispersant for chemical mechanical polishing that flattens a surface of at least one of an insulating layer and a wiring layer includes a block copolymer (P) having a polymer block A and B. The polymer block A has a structural unit derived from at least one monomer selected from the group consisting of an amide group-containing vinyl monomer and an ester group-containing vinyl monomer, and the polymer block B has a structural unit having an ionic functional group.

18 Claims, No Drawings

(56) References Cited

OTHER PUBLICATIONS

Office Action issued in Korean Application No. 10-2022-7016045;
Dated Oct. 5, 2024 (12 pages).
Notice of Final Rejection issued in corresponding Korean Application No. 10-2022-7016045, mailed Feb. 12, 2025 (8 pages).
Office Action issued in corresponding Chinese Patent Application No. 202080069040.5, dated Aug. 27, 2025, with translation (17 pages).

* cited by examiner

DISPERSANT AND POLISHING AGENT COMPOSITION

CROSS-REFERENCE TO RELATED APPLICATIONS

The present application claims priority from Japanese Patent Application Nos. 2019-239687, 2019-239688, and 2019-239689, which are filed on Dec. 27, 2019, and the contents of which are incorporated herein by reference in their entirety.

BACKGROUND

Technical Field

The present disclosure relates to a dispersant and a polishing agent composition, and more particularly, relates to a dispersant and a polishing agent composition for chemical mechanical polishing for flattening the surface of an insulating layer and/or a wiring layer formed on a wafer in a semiconductor production step.

Description of Related Art

Chemical mechanical polishing (CMP) technology is important for realizing high-precision multilayer wiring formation and used at stages such as flattening of an insulating film, formation of a metal plug, and formation of an embedded wiring in the production step of a semiconductor device. In CMP, a polishing agent composition is used in order to improve the processing speed and processing precision. The polishing agent composition generally includes a water-soluble polymer as a dispersant together with an abrasive grain and water (see, for example, Japanese Patent Laid-Open No. 2017-17177).

The water-soluble polymer is adsorbed on the surface of an abrasive grain to enhance the dispersibility of the abrasive grain, thereby suppressing the occurrence of a surface defect on an object to be polished. In addition, the water-soluble polymer contributes to improvement in the processing speed by being adsorbed on the surface of the object to be polished to make a polishing surface hydrophilic and increasing the contact frequency between the abrasive grain and the polishing surface. On the other hand, the water-soluble polymer also has the function of protecting the surface of the object to be polished to thereby suppress excessive polishing. Further, the effect of suppressing the firm adhesion of an abrasive grain and a foreign substance can be expected, and as a result, surface smoothing of the object to be polished can be carried out with high precision.

By containing a water-soluble polymer as a dispersant in a polishing agent composition, surface smoothing of an object to be polished can be carried out with high precision, whereas one molecule of the water-soluble polymer may be adsorbed on the surfaces of a plurality of abrasive grains in such a way as to form a bridge between the abrasive grains, causing aggregation of the abrasive grains. An aggregation structure due to such bridging between the abrasive grains tend to be more likely to occur under a strong shear force. In particular, in the case of use of cerium oxide as an abrasive grain, when a strong shear force is applied, the contact frequency between the abrasive grains increases and aggregation of the abrasive grains is likely to occur. In order to realize high-precision surface smoothing of a wiring layer and an insulating layer in the semiconductor production step, it is necessary to further improve the dispersion stability of an abrasive grain and suppress the aggregation of the abrasive grain due to a shear force.

SUMMARY

The present disclosure has been made in view of the above circumstances to provide a dispersant that has high dispersion stability of an abrasive grain and can suppress the aggregation of the abrasive grain due to a shear force.

The present inventors focused on a block copolymer having a specific structure. According to one or more embodiments, the following means are provided.

[1] A dispersant for chemical mechanical polishing used for surface flattening of an insulating layer and/or a wiring layer, wherein the dispersant comprises a block copolymer (P) having a polymer block A and a polymer block B; the polymer block A has a structural unit UA derived from at least one selected from the group consisting of an amide group-containing vinyl monomer and an ester group-containing vinyl monomer; and the polymer block B has a structural unit UB having an ionic functional group.

[2] The dispersant according to the above [1], wherein the structural unit UA comprises a structural unit derived from a vinyl monomer represented by formula (1):

$$CH_2=CR^1-C(=O)-NR^2-R^3 \qquad (1)$$

wherein $R^1$ is a hydrogen atom or a methyl group, and $R^2$ and $R^3$ are each independently a hydrogen atom or a substituted or unsubstituted monovalent hydrocarbon group, or $R^2$ and $R^3$ are a group that forms a ring together with a nitrogen atom to which $R^2$ and $R^3$ are attached by being bonded to each other.

[3] A dispersant for chemical mechanical polishing used for surface flattening of an insulating layer and/or a wiring layer, wherein the dispersant comprises a block copolymer (P) having a polymer block A and a polymer block B; the polymer block A and the polymer block B each have a structural unit having an ionic functional group; and the block copolymer (P) is a polymer that satisfies condition I and/or condition II:

Condition I: The ionic functional group of the polymer block A and the ionic functional group of the polymer block B are different from each other Condition II: A content of the ionic functional group of the polymer block A and a content of the ionic functional group of the polymer block B are different from each other.

[4] A dispersant for chemical mechanical polishing used for surface flattening of an insulating layer and/or a wiring layer, wherein the dispersant comprises a block copolymer (P) having a polymer block A and a polymer block B; and the polymer block A and the polymer block B each have a structural unit derived from a vinyl monomer represented by formula (1):

$$CH_2=CR^1-C(=O)-NR^2-R^3 \qquad (1)$$

wherein $R^1$ is a hydrogen atom or a methyl group, and $R^2$ and $R^3$ are each independently a hydrogen atom or a substituted or unsubstituted monovalent hydrocarbon group, or $R^2$ and $R^3$ are a group that forms a ring together with a nitrogen atom to which $R^2$ and $R^3$ are attached by being bonded to each other.

[5] The dispersant according to the above [4], wherein the polymer block A comprises a structural unit having a primary amide group and/or a hydroxyl group as the structural unit derived from a vinyl monomer represented by the formula (1).

[6] The dispersant according to the above [4] or [5], wherein the polymer block B comprises a structural unit having a secondary amide group and/or a tertiary amide group as the structural unit derived from a vinyl monomer represented by the formula (1).

[7] The dispersant according to any one of the above [4] to [6], wherein the polymer block B comprises a structural unit having a carboxyl group.

[8] The dispersant according to any one of [1] to [7], wherein a ratio (A/B) of the polymer block A to the polymer block B in the block copolymer (P) is 10/90 to 90/10 by mass ratio.

[9] The dispersant according to any one of the above [1] to [8], wherein the polymer block B further comprises a structural unit having an alkyl group having 1 to 10 carbon atoms in a side chain moiety.

[10] The dispersant according to any one of the above [1] to [9], wherein a molecular weight dispersity (Mw/Mn) represented by a ratio of a number average molecular weight Mn to a weight average molecular weight Mw of the block copolymer (P) is 2.0 or less.

[11] A polishing agent composition for chemical mechanical polishing used for surface flattening of an insulating layer and/or a wiring layer, wherein the polishing agent composition comprises the dispersant according to any one of the above [1] to [10] and cerium oxide.

DETAILED DESCRIPTION

According to the dispersant of one or more embodiments, because of the block copolymer (P), the dispersion stability of an abrasive grain is high, and the aggregation of an abrasive grain due to a shear force can be suppressed. In addition, such an effect of suppressing an aggregation of an abrasive grain is fully exhibited even when cerium oxide is used as an abrasive grain. Therefore, a semiconductor element having excellent surface flatness can be obtained by using the dispersant of one or more embodiments as a dispersant in a polishing agent composition for chemical mechanical polishing for flattening the surface of an insulating layer or a wiring layer in the semiconductor production step.

Hereinafter, embodiments will be described in detail. As used herein, "(meth)acrylic" means acrylic and/or methacrylic, and "(meth)acrylate" means acrylate and/or methacrylate. In addition, the "(meth)acryloyl group" means an acryloyl group and/or a methacryloyl group.

The dispersant of one or more embodiments is a dispersant for chemical mechanical polishing used for flattening the surface of an insulating layer and/or a wiring layer formed on a wafer (for example, a silicon wafer) in the semiconductor production step. In addition, the polishing agent composition of one or more embodiments contains cerium oxide (ceria) as an abrasive grain and the dispersant of one or more embodiments.

Hereinafter, the dispersant and the polishing agent compositions of one or more embodiments will be described.

First Embodiment

<<Dispersant>>

The dispersant in the first embodiment comprises, as a water-soluble polymer, a block copolymer (P) comprising a polymer block A having a structural unit UA derived from at least one selected from the group consisting of an amide group-containing vinyl monomer and an ester group-containing vinyl monomer and a polymer block B having a structural unit UB having an ionic functional group.

4

<Block copolymer (P)>

Polymer Block A

The polymer block A has a main chain consisting of a carbon-carbon bond derived from a vinyl monomer. The polymer block A having a main chain consisting of a carbon-carbon bond has high adsorptivity to an abrasive grain, and also appropriately adsorbs to an object to be polished having a hydrophobic surface, and imparts good wettability to a polishing surface.

The amide group-containing vinyl monomer and the ester group-containing vinyl monomer constituting the structural unit UA are not particularly limited. Examples of the amide group-containing vinyl monomer include (meth)acrylamide; a (di)alkyl(meth)acrylamide such as N-methyl(meth)acrylamide, N,N-dimethyl(meth)acrylamide, N-ethyl(meth)acrylamide, N-ethyl-N-methyl(meth)acrylamide, N,N-diethyl (meth)acrylamide, N-(n-propyl) (meth)acrylamide, N-(t-butyl) (meth)acrylamide, N-isopropyl(meth)acrylamide, N-(n-butyl) (meth)acrylamide, and N-(2-ethylhexyl) (meth) acrylamide; a (di)alkylaminoalkylamide such as N-[3-(dimethylamino)propyl](meth)acrylamide, N-[3-(methylamino) propyl](meth)acrylamide, N-[3-(ethylamino)propyl](meth) acrylamide, and N-[3-(diethylamino)propyl](meth) acrylamide; a heterocyclic ring-containing (meth) acrylamide such as 4-(meth)acryloylmorpholine; a sulfonic acid group-containing (meth)acrylamide such as 2-(meth) acrylamido-2-methylpropanesulfonic acid or a salt thereof; a hydroxyl group-containing (meth)acrylamide such as 2-hydroxyethylacrylamide; and an N-vinylamide such as N-vinylacetamide, N-vinylformamide, N-vinylisobutylamide, N-vinyl-2-pyrrolidone, and N-vinyl-ε-caprolactam.

Specific examples of the ester group-containing vinyl monomer include a (meth)acrylic acid alkyl ester such as methyl (meth)acrylate, ethyl (meth)acrylate, n-propyl (meth)acrylate, isopropyl (meth)acrylate, n-butyl (meth) acrylate, isobutyl (meth)acrylate, tert-butyl (meth)acrylate, n-pentyl (meth)acrylate, isoamyl (meth)acrylate, n-hexyl (meth)acrylate, n-octyl (meth)acrylate, ethylhexyl (meth) acrylate, and n-decyl (meth)acrylate;

an aliphatic cyclic ester of (meth)acrylic acid such as cyclohexyl (meth)acrylate, methylcyclohexyl (meth) acrylate, tert-butylcyclohexyl (meth)acrylate, cyclododecyl (meth)acrylate, isobornyl (meth)acrylate, adamantyl (meth)acrylate, dicyclopentenyl (meth)acrylate, and dicyclopentanyl (meth)acrylate;

an aromatic ester of (meth)acrylic acid such as phenyl (meth)acrylate, benzyl (meth)acrylate, phenoxymethyl (meth)acrylate, 2-phenoxyethyl (meth)acrylate, and 3-phenoxypropyl (meth)acrylate;

an alkoxyalkyl (meth)acrylate such as 2-methoxyethyl (meth)acrylate, 3-methoxypropyl (meth)acrylate, 4-methoxybutyl (meth)acrylate, and 2-ethoxyethyl (meth)acrylate;

a hydroxyalkyl (meth)acrylate such as 2-hydroxyethyl (meth)acrylate, 3-hydroxypropyl (meth)acrylate, and 4-hydroxybutyl (meth)acrylate; a (di)alkylaminoalkyl (meth)acrylate such as N-[2-(methylamino)ethyl] (meth)acrylate, N-[2-(dimethylamino)ethyl](meth) acrylate, N-[2-(ethylamino)ethyl](meth)acrylate, and N-[2-(diethylamino)ethyl](meth)acrylate;

an epoxy group-containing (meth)acrylic acid ester such as glycidyl (meth)acrylate, 4-hydroxybutyl (meth)acrylate glycidyl ether, and 3,4-epoxycyclohexylmethyl (meth)acrylate; and a polyoxyalkylene (meth)acrylate such as polyoxyethylene (meth)acrylate and polyoxypropylene (meth)acrylate.

The polymer block A preferably has at least a structural unit derived from an amide group-containing vinyl monomer as the structural unit UA. The polymer block A that has a structural unit derived from an amide group-containing monomer is preferable in that good dispersion stability can be imparted to an abrasive grain (particularly cerium oxide), and the effect of suppressing the aggregation of the abrasive grain due to a shear force can be enhanced. Above all, the structural unit UA preferably includes a structural unit derived from an amide group-containing vinyl monomer represented by the following formula (1).

$$CH_2=CR^1—C(=O)—NR^2—R^3 \qquad (1)$$

wherein $R^1$ is a hydrogen atom or a methyl group, and $R^2$ and $R^3$ are each independently a hydrogen atom or a substituted or unsubstituted monovalent hydrocarbon group, or $R^2$ and $R^3$ are a group that forms a ring together with a nitrogen atom to which $R^2$ and $R^3$ are attached by being bonded to each other.

In the vinyl monomer represented by the above formula (1), when $R^2$ and/or $R^3$ is a substituted monovalent hydrocarbon group, examples of the substituted monovalent hydrocarbon group include a group having a secondary amino group, a group having a tertiary amino group, and a hydroxyalkyl group. Examples of the vinyl monomer represented by the above formula (1) include (meth)acrylamide, a (di)alkyl(meth)acrylamide, a (di)alkylaminoalkylamide, a heterocyclic ring-containing (meth)acrylamide, a sulfonic acid group-containing (meth)acrylamide, and a hydroxyl group-containing (meth)acrylamide. Among these, at least one selected from the group consisting of (meth)acrylamide, N-methyl(meth)acrylamide, N-ethyl(meth)acrylamide, N,N-dimethyl(meth)acrylamide, N,N-diethyl(meth)acrylamide, N-ethyl-N-methyl(meth)acrylamide, 4-(meth)acryloylmorpholine, 2-hydroxyethylacrylamide, and 2-(meth)acrylamido-2-methylpropanesulfonic acid or a salt thereof is preferable.

The structural unit UA of the polymer block A is preferably a structural unit derived from a water-soluble monomer. Specifically, the amide group-containing vinyl monomer is preferably at least one selected from the group consisting of preferable examples of the vinyl monomer represented by the above formula (1) and N-vinyl-2-pyrrolidone. The ester group-containing vinyl monomer is, among the above, preferably at least one selected from the group consisting of methyl acrylate, a hydroxyalkyl (meth)acrylate in which the alkyl group of the alkyl ester moiety has 1 to 4 carbon atoms, and a polyoxyalkylene (meth)acrylate. As used herein, the "water-soluble monomer" refers to a compound having a solubility of 2 g or more in 100 g of water at 20° C.

The polymer block A may be a block consisting only of the structural unit UA, and may further have a structural unit derived from a monomer different from the amide group-containing vinyl monomer and the ester group-containing vinyl monomer (hereinafter, also referred to as "another monomer M1") as long as the action of the block copolymer (P) is not impaired.

Another monomer M1 is not particularly limited as long as it is a monomer copolymerizable with the amide group-containing vinyl monomer and the ester group-containing vinyl monomer. Examples of another monomer M1 include an alkyl vinyl ether, a vinyl alcohol, an aromatic vinyl compound, a vinyl ester compound, an α-olefin, an unsaturated acid, and an unsaturated acid anhydride.

As specific examples of another monomer M1, examples of the alkyl vinyl ether include methyl vinyl ether, ethyl vinyl ether, n-propyl vinyl ether, isopropyl vinyl ether, n-butyl vinyl ether, isobutyl vinyl ether, t-butyl vinyl ether, n-hexyl vinyl ether, 2-ethylhexyl vinyl ether, n-octyl vinyl ether, n-nonyl vinyl ether, and n-decyl vinyl ether; examples of the vinyl alcohol include vinyl alcohol, 2-hydroxyethyl vinyl ether, diethylene glycol monovinyl ether, and 4-hydroxybutyl vinyl ether; examples of the aromatic vinyl compound include styrene, vinyl toluene, and vinyl xylene; examples of the vinyl ester compound include vinyl formate, vinyl acetate, vinyl propionate, and vinyl benzoate; examples of the α-olefin include ethylene, propylene, and butylene; examples of the unsaturated acid include (meth)acrylic acid, crotonic acid, maleic acid, itaconic acid, and fumaric acid; and examples of the unsaturated acid anhydride such as maleic anhydride. As another monomer M1, these can be used singly or in combinations of two or more.

For the polymer block A, the content of the structural unit UA is preferably 70% by mass or more based on all the constituent monomer units of the polymer block A. A content of the structural unit UA of 70% by mass or more is preferable in that a polymer block A having excellent adsorptivity to an abrasive grain can be obtained. From this viewpoint, the content of the structural unit UA is more preferably 80% by mass or more, further preferably 90% by mass or more, more further preferably 95% by mass or more, and particularly preferably 99% by mass or more, based on all the constituent monomer units of the polymer block A.

The content of the structural unit derived from the amide group-containing vinyl monomer of the polymer block A is preferably equal to or more than the content of the structural unit derived from the amide group-containing vinyl monomer in the polymer block B, and is more preferably more than the content of the structural unit derived from the amide group-containing vinyl monomer in the polymer block B. Specifically, the content of the structural unit derived from the amide group-containing vinyl monomer in the polymer block A is preferably 10% by mass or more, more preferably 30% by mass or more, further preferably 50% by mass or more, more further preferably 70% by mass or more, and particularly preferably 90% by mass or more, based on all the constituent monomer units of the polymer block A.

The number average molecular weight (Mn) of the polymer block A is preferably in the range of 1,000 or more and 200,000 or less. An Mn of 1,000 or more is preferable in that the effect of improving the adsorptivity to an abrasive grain by introducing the polymer block A is sufficiently developed. In addition, an Mn of 200,000 or less is preferable in that the formation of an aggregation structure of an abrasive grain by adsorbing one molecule of the polymer on the surfaces of a plurality of abrasive grains can be sufficiently suppressed. The Mn of the polymer block A is more preferably 1,500 or more, and further preferably 2,000 or more. In addition, the Mn of the polymer block A is more preferably 150,000 or less, further preferably 100,000 or less, and particularly preferably 70,000 or less. As used herein, the number average molecular weight (Mn) and the weight average molecular weight (Mw) of the polymer are values in terms of sodium polyacrylate measured by gel permeation chromatography (GPC). More specifically, these are values measured by the method described in Examples described later.

Polymer Block B

The ionic functional group of the structural unit UB is preferably a carboxyl group, a sulfonic acid group, and a phosphoric acid group, a phosphonic acid group, an amino group, or a salt thereof in that appropriate adsorptivity to an abrasive grain (particularly cerium oxide) is exhibited and that good dispersion stability can be imparted to the abrasive grain. Among them, the ionic functional group is preferably an anionic functional group such as a carboxyl group, a sulfonic acid group, a phosphoric acid group, or a phosphonic acid group, or a salt thereof, and is particularly preferably a carboxyl group, a sulfonic acid group, or a salt of a carboxyl group or a sulfonic acid group.

The structural unit UB is preferably introduced into the block copolymer (P) by polymerization using a monomer having an ionic functional group (hereinafter, also referred to as an "ionic group-containing monomer"). The ionic group-containing monomer is not particularly limited as long as it is a monomer copolymerizable with a constituent monomer of the polymer block A, and is preferably a vinyl monomer in that the adsorptivity to an abrasive grain and an object to be polished having a hydrophobic surface is good and that the degree of freedom in selecting a monomer is high.

Specific examples of the ionic group-containing monomer include a vinyl monomer having a carboxyl group such as (meth)acrylic acid, crotonic acid, itaconic acid, maleic acid, fumaric acid, monobutyl itaconate, monobutyl maleate, cyclohexenedicarboxylic acid, or salts thereof; a vinyl monomer having a sulfonic acid group such as 2-(meth) acrylamido-2-methylpropanesulfonic acid, 2-(meth)acry-loylethanesulfonic acid, or salts thereof; a vinyl monomer having a phosphoric acid group or a phosphonic acid group such as allylphosphonic acid, vinylphosphonic acid, acid phosphooxyethyl methacrylate, acid phosphooxypropyl methacrylate, 3-chloro-2-acid phosphooxypropyl methacrylate, or salts thereof; a vinyl monomer having an amino group such as N,N-dimethylaminoethyl (meth)acrylate, N,N-diethylaminoethyl (meth)acrylate, N,N-dimethylami-nopropyl (meth)acrylate, N,N-dimethylaminopropyl(meth) acrylamide, or salts thereof; a vinyl monomer having a quaternary ammonium salt such as trimethyl-2-(meth)acry-loyloxyethylammonium chloride, N-(2-(meth)acryloyloxy-ethyl)-N-benzyl-N,N-dimethylammonium chloride, or (3-(meth)acrylamidopropyl)trimethylammonium chloride.

For counterions when the ionic functional group is a salt, examples of a counterion of the cationic functional group include a chloride ion, a bromide ion, and iodide ion; and examples of a counterion of the anionic functional group include a sodium ion, a magnesium ion, and a calcium ion. As the ionic group-containing monomer, these can be used singly or in combinations of two or more.

The polymer block B may be a block consisting only of the structural unit UB, and may further have a structural unit derived from a monomer different from the ionic group-containing monomer (hereinafter, also referred to as "another monomer M2") as long as the action of the block copolymer (P) is not impaired.

Another monomer M2 is not particularly limited as long as it is a monomer copolymerizable with the ionic group-containing monomer, and examples thereof include a vinyl monomer having no ionic functional group among an amide group-containing vinyl monomer and an ester group-containing vinyl monomer as well as another monomer M1 used for producing the polymer block A. As another monomer M2, these can be used singly or in combinations of two or more.

The polymer block B may include, together with the structural unit UB, a structural unit having an alkyl group having 1 to 10 carbon atoms in a side chain moiety (hereinafter, also referred to as a "structural unit UC"). The polymer block B that has a structural unit UC is preferable in that the hydrophobicity of the polymer block B is enhanced and that the adsorptivity to an abrasive (particularly cerium oxide) can be further improved. The alkyl group which the structural unit UC has in a side chain moiety preferably has 2 or more carbon atoms from the viewpoint of further enhancing the dispersion stability of an abrasive grain. The upper limit of the number of carbon atoms of the alkyl group which the structural unit UC has in a side chain moiety is preferably 8 or less, and more preferably 7 or less, from the viewpoint of obtaining a polymer having high solubility in an aqueous system. The alkyl group is preferably bonded to the main chain via a linking group (—COO—, —CONH—, or the like).

The monomer constituting the structural unit UC is preferably at least one selected from the group consisting of an ester group-containing vinyl monomer and an amide group-containing vinyl monomer. Among these, at least one selected from the group consisting of a (meth)acrylic acid alkyl ester in which the alkyl group of the alkyl ester moiety has 1 to 10 carbon atoms and an N-alkyl(meth)acrylamide in which the N-alkyl group has 1 to 10 carbon atoms is preferable, and at least one selected from the group consisting of a (meth)acrylic acid alkyl ester in which the alkyl group of the alkyl ester moiety has 2 to 10 carbon atoms and an N-alkyl(meth)acrylamide in which the N-alkyl group has 2 to 10 carbon atoms is more preferable, in that the effect of improving the dispersion stability of an abrasive grain is high. The polymer block B may have only one structural unit UC, or may have two or more.

In the polymer block B, the content of the structural unit UB is preferably 40% by mass or more based on all the constituent monomer units of the polymer block B. A content of the structural unit UB of 40% by mass or more is preferable in that a polymer block B having excellent dispersion stability of an abrasive grain can be obtained. From this viewpoint, the content of the structural unit UB is more preferably 50% by mass or more, further preferably 60% by mass or more, more further preferably 70% by mass or more, and particularly preferably 80% by mass or more, based on all the constituent monomer units of the polymer block B. When a structural unit derived from another monomer is introduced, the upper limit of the content of the structural unit UB is preferably 99% by mass or less, more preferably 97% by mass or less, and further preferably 95% by mass or less, based on all the constituent monomer units of the polymer block B.

The content of the structural unit UC is preferably 1% by mass or more, more preferably 2% by mass or more, further preferably 5% by mass or more, and particularly preferably 10% by mass or more, based on all the constituent monomer units of the polymer block B from the viewpoint of improving the adsorptivity to an abrasive grain and sufficiently obtaining the effect of improving the dispersion stability of the abrasive grain. The upper limit of the content of the structural unit UC is preferably 50% by mass or less, more preferably 30% by mass or less, and further preferably 25% by mass or less, based on all the constituent monomer units of the polymer block B.

In the block copolymer (P), at least the polymer block B is a copolymer having an ionic functional group, and further, the polymer block A may have an ionic functional group. When the polymer block A has an ionic functional group, the polymer block A and the polymer block B preferably satisfy the following condition I, condition II, or both.

Condition I: The ionic functional group of the polymer block A and the ionic functional group of the polymer block B are different from each other.

Condition II: The content of the ionic functional group of the polymer block A is less than the content of the ionic functional group of the polymer block B.

When the polymer block A has an ionic functional group, the ionic functional group is preferably a sulfonic acid group or a carboxyl group, and more preferably a sulfonic acid group, from the viewpoint of exhibiting appropriate adsorptivity to an abrasive grain (particularly cerium oxide) and imparting good dispersion stability to the abrasive grain. For the above condition I, the combination of the ionic functional group of the polymer block A and the ionic functional group of the polymer block B is not particularly limited. When the polymer block A, the polymer block B, or both has a plurality of ionic functional groups, at least one of the ionic functional groups of each polymer block may be a different ionic functional group. Preferable specific examples of a combination satisfying condition I include an example in which the ionic functional group of the polymer block A is a sulfonic acid group and the ionic functional group of the polymerizable block B is a carboxyl group.

When only condition I is satisfied, the content of the structural unit having an ionic functional group in the polymer block A is preferable 1000 parts by mass or less, and more preferably 800 parts by mass or less, per 100 parts by mass of the structural unit UB having an ionic functional group in the polymer block B.

For the above condition II, the preferable range of the content of the structural unit having an ionic functional group in the polymer block A differs depending on whether or not the above condition I is satisfied. When condition I is satisfied, the content of the structural unit having an ionic functional group in the polymer block A is preferable 90 parts by mass or less, and more preferably 80 parts by mass or less, per 100 parts by mass of the structural unit UB having an ionic functional group in the polymer block B. When condition I is not satisfied, the content of the structural unit having an ionic functional group in the polymer block A is preferable 75 parts by mass or less, more preferably 50 parts by mass or less, further preferably 30 parts by mass or less, and more further preferably 10 parts by mass or less, per 100 parts by mass of the structural unit UB having an ionic functional group in the polymer block B.

The polymer block A that has substantially no structural unit derived from an ionic functional group is preferable because the difference in the adsorptivity to an abrasive grain and an object to be polished becomes larger in one molecule of the polymer, and the formation of an aggregation structure of the abrasive grain due to a shear force can be further suppressed.

In addition, in the block copolymer (P), at least the polymer block A has a structural unit UA, and preferably has a structural unit derived from an amide group-containing vinyl monomer. On the other hand, the polymer block B may or may not have a structural unit derived from an amide group-containing vinyl monomer. When the polymer block B has a structural unit derived from an amide group-containing vinyl monomer, the polymer block A and the polymer block B preferably satisfy the above condition II, and the polymer block A particularly preferably has substantially no ionic functional group, in that the formation of an aggregation structure of an abrasive grain due to a shear force is further reduced. A used herein, "substantially have no ionic functional group" means that a compound having an ionic functional group is not used as a monomer raw material.

The number average molecular weight (Mn) in terms of sodium polyacrylate measured by GPC of the polymer block B is preferably in the range of 1,000 or more and 200,000 or less. An Mn of 1,000 or more is preferable in that the effect of improving the adsorptivity to an abrasive grain by introducing the polymer block B into a molecule is sufficiently developed. In addition, an Mn of 200,000 or less is preferable in that the block copolymer (P) obtained can suppress the aggregation of an abrasive grain due to a shear force and can sufficiently secure the dispersion stability of the abrasive grain. The Mn of the polymer block A is more preferably 1,500 or more, further preferably 2,000 or more, and particularly preferably 2,500 or more. The upper limit of the Mn of the polymer block A is more preferably 150,000 or less, further preferably 100,000 or less, and particularly preferably 70,000 or less.

<Production of Block Copolymer (P)>

The block copolymer (P) is not particularly limited in the method for producing the same as long as a block copolymer having two or more different segments can be obtained, and can be produced by adopting a known production method. Specific examples of the method for producing the block copolymer (P) include various controlled polymerization methods such as living radical polymerization and living anionic polymerization, and a method for coupling polymers having a functional group to each other. Among these, the living radical polymerization method is preferable in that the method can produce a block copolymer (P) having high molecular weight dispersity (PDI) controllability and excellent dispersion stability of an abrasive grain, and that the method is easy to operate and can be applied to a wide range of monomers. When the living radical polymerization method is adopted, the polymerization type is not particularly limited, and the method can be carried out in various forms such as bulk polymerization, solution polymerization, emulsion polymerization, mini-emulsion polymerization, and suspension polymerization.

For example, when the living radical polymerization method is adopted and a block copolymer (P) is produced by solution polymerization, the target block copolymer (P) can be obtained by placing an organic solvent and a monomer in a reactor and adding a radical polymerization initiator, and preferably heating the mixture to carry out polymerization. The polymerization may adopt any process such as a batch process, a semi-batch process, a dry continuous polymerization process, or a continuous stirred tank reactor process (CSTR).

In the production of the block copolymer (P), a known polymerization method can be adopted as the living radical polymerization method. Specific examples of the living radical polymerization method used include a living radical polymerization method having a degenerative chain transfer mechanism, a living radical polymerization method having a bond-dissociation mechanism, and a living radical polymerization method having an atomic transfer mechanism. Specific examples of the living radical polymerization method having a degenerative chain transfer mechanism include a reversible addition-fragmentation chain transfer polymerization method (RAFT method), an iodine transfer polymerization method, a polymerization method using an organic tellurium compound (TERP method), a polymerization method using an organic antimony compound (SBRP method), and a polymerization method using an organic bismuth compound (BIRP method); specific examples of the living radical polymerization method having a bond-dissociation mechanism include a nitroxy radical method (NMP method); and specific examples of the living radical polymerization method having an atomic transfer mechanism include an atom transfer radical polymerization method (ATRP method). Among these, the living radical polymerization method having a degenerative chain transfer or a bond-dissociation mechanism is preferable in that the method can be applied to the widest range of vinyl monomers and has excellent polymerization controlling properties, and the RAFT method or the NMP method is preferable in that the method can avoid contamination of an object to be polished due to the mixing of a metal or metalloid compound, and the RAFT method is particularly preferable from the viewpoint of being easy to carry out.

In the RAFT method, polymerization proceeds via a reversible chain transfer reaction in the presence of a polymerization control agent (RAFT agent) and a free radical polymerization initiator. As the RAFT agent, various known RAFT agents such as a dithioester compound, a xanthate compound, a trithiocarbonate compound, and a dithiocarbamate compound can be used. Of these, a trithiocarbonate compound and a dithiocarbamate compound are preferable in that a polymer having a smaller molecular weight dispersity can be obtained. In addition, as the RAFT agent, a monofunctional compound having only one active site may be used, or a polyfunctional compound having two or more active sites may be used. By using these compounds, a polymer having a narrower molecular weight dispersity can be obtained. The amount of the RAFT agent used is appropriately adjusted depending on the monomer used, the type of the RAFT agent, and the like.

As the polymerization initiator used in the polymerization by the RAFT method, a known radical polymerization initiator such as an azo compound, an organic peroxide, and a persulfate can be used. Among these, an azo compound is preferable in that it is easy to handle for safety and a side reaction during radical polymerization is unlikely to occur. Specific examples of the azo compound include 2,2'-azobis (isobutyronitrile), 2,2'-azobis(2,4-dimethylvaleronitrile), and 4,4'-azobis(4-cyanovaleric acid), 2,2'-azobis(4-methoxy-2,4-dimethylvaleronitrile), dimethyl-2,2'-azobis (2-methylpropionate), 2,2'-azobis(2-methylbutyronitrile), 1,1'-azobis(cyclohexane-1-carbonitrile), 2,2'-azobis[N-(2-propenyl)-2-methylpropionamide], and 2,2'-azobis(N-butyl)-2-methylpropionamide). As the radical polymerization initiator, only one may be used, or two or more may be used in combination.

The amount of the radical polymerization initiator used is not particularly limited, and is preferably 0.5 mol or less, and more preferably 0.2 mol or less, per mol of the RAFT agent, from the viewpoint of obtaining a polymer having a smaller molecular weight dispersity. In addition, from the viewpoint of stably carrying out the polymerization reaction, the lower limit of the amount of the radical polymerization initiator used is preferably 0.01 mol or more, and more preferably 0.05 mol or more, per mol of the RAFT agent. The amount of the radical polymerization initiator used per mol of the RAFT agent is preferably 0.01 to 0.5 mol, and more preferably 0.05 to 0.2 mol.

When a solvent is used in a living radical polymerization, examples of the polymerization solvent include an aromatic compound such as benzene, toluene, xylene, and anisole; an ester compound such as methyl acetate, ethyl acetate, propyl acetate, and butyl acetate; a ketone compound such as acetone and methyl ethyl ketone; dimethylformamide, acetonitrile, dimethylsulfoxide, alcohol, and water. As the polymerization solvent, these can be used singly or in combinations of two or more.

In the polymerization reaction by the RAFT method, the reaction temperature is preferably 40° C. or more and 100°

C. or less, more preferably 45° C. or more and 90° C. or less, and further preferably 50° C. or more and 80° C. or less. A reaction temperature of 40° C. or more is preferable in that the polymerization reaction can proceed smoothly, and a reaction temperature of 100° C. or less is preferable in that a side reaction can be suppressed and that restrictions on the initiator and solvent that can be used are relaxed. In addition, the reaction time can be appropriately set depending on the monomer used and the like, and is preferably 1 hour or more and 48 hours or less, and more preferably 3 hours or more and 24 hours or less. If necessary, the polymerization may be carried out in the presence of a chain transfer agent (for example, an alkylthiol compound having 2 to 20 carbon atoms). In the production step, particularly when a monomer having an acidic group is used, if there is a concern that a metal may be mixed because of corrosion of the reactor, or the like, production using a facility whose surface is coated with a fluororesin or the like is preferable. In addition, in this case, the storage container for the product or the like is preferably a container made of a resin having corrosion resistance or the like. When a container made of a resin is used, the container is preferably made of a material in which metal mixing due to dissolution of a filler or the like is suppressed.

The number average molecular weight (Mn) in terms of sodium polyacrylate measured by GPC of the block copolymer (P) is preferably in the range of 2,000 or more and 300,000 or less. An Mn of 2,000 or more is preferable in that a decrease in the polishing rate can be suppressed while the wettability of the surface of an object to be polished is sufficiently secured. In addition, an Mn of 300,000 or less is preferable in that the aggregation of an abrasive grain due to a shear force can be sufficiently suppressed and that the occurrence of a defect such as a scratch can be sufficiently suppressed during polishing. From these viewpoints, the Mn of the block copolymer (P) is more preferably 2,500 or more, further preferably 3,000 or more, and more further preferably 3,500 or more. The upper limit of the Mn of the block copolymer (P) is more preferably 200,000 or less, further preferably 150,000 or less, more further preferably 110,000 or less, and particularly preferably 100,000 or less.

The weight average molecular weight (Mw) in terms of sodium polyacrylate measured by GPC of the block copolymer (P) is preferably in the range of 3,000 or more and 400,000 or less. The Mw of the block copolymer (P) is more preferably 4,000 or more, and further preferably 5,000 or more. The upper limit of the Mw of the block copolymer (P) is more preferably 300,000 or less, further preferably 220,000 or less, more further preferably 150,000 or less, and particularly preferably 100,000 or less.

The molecular weight dispersity (PDI=(Mw/Mn)) represented by the ratio of the weight average molecular weight Mw to the number average molecular weight Mn of the block copolymer (P) is preferably 2.5 or less. It is considered that the magnitude of the molecular weight of a polymer exhibiting the dispersion function of an abrasive grain affects the rate of adsorption to/desorption from an object to be polished, and it is generally considered that the smaller the molecular weight of the polymer, the higher the rate of adsorption to/desorption from the object to be polished. In addition, it is considered that a polymer having a large molecular weight is likely to form an aggregation structure of an abrasive grain due to a shear force. Because of this, the polymer used for an application as a dispersant for an abrasive grain preferably has a narrow molecular weight distribution.

From these viewpoints, the PDI of the block copolymer (P) is more preferably 2.0 or less, further preferably 1.8 or less, more further preferably 1.5 or less, and particularly preferably 1.3 or less.

The lower limit of the PDI is usually 1.0.

The ratio A/B (mass ratio) of the polymer block A and the polymer block B in one molecule of the block copolymer (P) is preferably 5/95 to 95/5, from the viewpoint of suppressing the formation of an aggregation structure of an abrasive grain due to a shear force. The ratio A/B is more preferably 10/90 to 90/10, further preferably 15/85 to 85/15, more further preferably 20/80 to 80/20, and particularly preferably 25/75 to 75/25. The ratio A/B can be appropriately selected by adjusting the ratio of the monomer used for producing the polymer block A to the monomer used for producing the polymer block B.

As long as the block copolymer (P) has the polymer block A and the polymer block B, the numbers, the arrangement order, and the like of the polymer block A and the polymer block B in one molecule are not particularly limited. Specific examples of the block copolymer (P) include a (AB) diblock form consisting of a polymer block A and a polymer block B, a (ABA) triblock form consisting of polymer block A/polymer block B/polymer block A, and a (BAB) triblock form consisting of polymer block B/polymer block A/polymer block B. In addition, the block copolymer (P) may be a multi-block copolymer having four or more polymer blocks, and may further have a polymer block other than the polymer block A and the polymer block B. Of these, the block copolymer (P) is preferably a diblock copolymer having an AB-type structure in that a block copolymer (P) having sufficiently high dispersion stability of an abrasive grain (particularly cerium oxide) can be efficiently produced.

The dispersant of the present embodiment may be any one containing the block copolymer (P). Therefore, the dispersant may be in a form consisting of a single component containing only the block copolymer (P), or may be in a form including a component different from the block copolymer (P) (hereinafter, also referred to as "another component") together with the block copolymer (P).

The dispersant of the present embodiment can include a solvent as another component. Examples of the solvent include water, an organic solvent, and a mixed solvent of water and an organic solvent. Of these, the solvent contained in the dispersant is preferably a solvent that can dissolve the block copolymer (P), which is a water-soluble polymer, more preferably a water or a mixed solvent of water and an organic solvent soluble in water, and particularly preferably water. Examples of the organic solvent used with water include an alcohol such as methanol, ethanol, propanol, and butanol; a ketone such as acetone and methyl ethyl ketone; an alkylene glycol such as ethylene glycol and propylene glycol; an ether such as ethylene glycol monomethyl ether, propylene glycol monomethyl ether, ethylene glycol dimethyl ether, and tetrahydrofuran; an ester such as ethylene glycol monomethyl ether acetate and ethyl acetate; and an amide-based solvent such as N,N-dimethylformamide and N,N-dimethylacetamide. As the organic solvent, one alone can be used or two or more can be used in combination.

When the dispersant contains a block copolymer (P) and a solvent, the content of the block copolymer (P) is preferably 1% by mass or more, more preferably 5% by mass or more, and further preferably 10% by mass or more, based on the total mass of the block copolymer (P) and the solvent, from the viewpoint of sufficient contact between the surface of an object to be polished and a polishing pad and the block copolymer (P). In addition, the upper limit of the content of the block copolymer (P) is preferably 70% by mass or less, more preferably 60% by mass or less, and further preferably 50% by mass or less, based on the total mass of the block copolymer (P) and the solvent from the viewpoint of suppressing the deterioration of handleability due to excessively high viscosity.

<<Polishing Agent Composition>>

The polishing agent composition of the present embodiment contains cerium oxide (ceria) as an abrasive grain and the above dispersant. Cerium oxide has the following advantages: a polishing surface can be polished at a higher polishing rate than that in the case of silica, alumina, and the like, and the hardness is lower than that of alumina and the like and the occurrence of a defect on the polishing surface can be suppressed.

Cerium oxide is used in the form of a particle. The average particle size of cerium oxide is not particularly limited, and is generally 1 nm to 500 nm. The average particle size is preferably 2 nm or more, and more preferably 3 nm or more, from the viewpoint of securing a high polishing rate. The upper limit of the average particle size is preferably 300 nm or less, and more preferably 100 nm or less, from the viewpoint of suppressing the occurrence of a scratch on the surface of an object to be polished. As used herein, the average particle size of cerium oxide is the primary particle size calculated by using the specific surface area ($m^2$/g) calculated by a BET (nitrogen adsorption) method.

The content of cerium oxide in the polishing agent composition is preferably 5% by mass or more, more preferably 10% by mass or more, and further preferably 15% by mass or more, from the viewpoint of realizing a high polishing rate. The upper limit of the content of cerium oxide is preferably 50% by mass or less, more preferably 45% by mass or less, and further preferably 40% by mass or less, from the viewpoint of making the smoothness of an object to be polished good.

The content of the dispersant is preferably an amount such that the solid concentration of the block copolymer (P) is 0.001% by mass or more based on the total amount of the polishing agent composition and is more preferably an amount such that the solid concentration of the block copolymer (P) is 1% by mass or more. The upper limit of the content of the dispersant is preferably an amount such that the solid concentration of the block copolymer (P) is 10% by mass or less based on the total amount of the polishing agent composition and is more preferably an amount such that the solid concentration of the block copolymer (P) is 5% by mass or less.

The polishing agent composition may include a solvent. The solvent is preferably an aqueous solvent, and examples thereof include water or a mixed solvent of water and a solvent. The solvent is preferably a solvent that is compatible with water, and examples thereof include an alcohol such as ethanol. In addition, the polishing agent composition may further contain a known additive such as a polishing accelerator, a pH adjuster, a surfactant, a chelating agent, and an anticorrosive agent, as long as the advantageous effects of the present embodiment are not impaired.

The polishing agent composition is usually prepared as a slurry-like mixture by mixing each component by a known method. The viscosity of the polishing agent composition at 25° C. can be appropriately selected depending on the object to be polished, the shear speed during polishing, and the like, and is preferably in the range of 0.1 to 10 mPa·s, and more preferably in the range of 0.5 to 5 mPa·s.

The polishing agent composition of the present embodiment contains a block copolymer (P) as a dispersant, and thus the dispersion stability of an abrasive grain (particularly a ceria particle) is high, and the effect of suppressing the aggregation of the abrasive grain due to a shear force is high. Therefore, the polishing agent composition of the present embodiment is preferable in that by being used as a polishing liquid for an application flattening the surface of an insulating film, a metal wiring, or both in the production step of a semiconductor element, specifically, for example for flattening an oxide film (a silicon oxide film or the like) during shallow trench isolation (STI) creation, flattening the surface of a metal wiring made of copper, a copper alloy, an aluminum alloy, or the like, or flattening the surface of an interlayer insulating film (oxide film), the occurrence of a defect is reduced and an insulating film and a metal wiring having excellent surface smoothness can be obtained.

Example 1

Hereinafter, the present embodiment will be specifically described with reference to Examples, but the present disclosure is not limited to these Examples. In the following, "parts" and "%" mean "parts by mass" and "% by mass", respectively, unless otherwise specified. The method for measuring the molecular weight of a polymer is as follows.

<Measurement of Molecular Weight>

The obtained polymer was subjected to gel permeation chromatography (GPC) measurement under the following conditions to obtain a number average molecular weight (Mn) and a weight average molecular weight (Mw) in terms of sodium polyacrylate. In addition, the molecular weight dispersity (PDI=Mw/Mn) was calculated from the obtained Mn and Mw values.

○Measurement Conditions

Apparatus name: Tosoh Corporation HLC-8420GPC

Column: Tosoh TSK-GEL400PWXL (estimated exclusion limit of 1 million)

Sodium polyacrylate standard substance molecular weights: (Mp: peak top molecular weight, Mn: number average molecular weight, Mw: weight average molecular weight)

Sample 1: Mp=1250, Mn=1230, Mw=1930

Sample 2: Mp=2925, Mn=2280, Mw=3800

Sample 3: Mp=7500, Mn=6200, Mw=8300

Sample 4: Mp=16000, Mn=12800, Mw=18100

Sample 5: Mp=28000, Mn=23100, Mw=37100

Sample 6: Mp=62900, Mn=47900, Mw=83400

Sample 7: Mp=130500, Mn=97800, Mw=165300

Sample 8: Mp=392600, Mn=311300, Mw=495000

Calibration curve: Prepared by a cubic formula using the Mp of the above sodium polyacrylate standard substance molecular weights Solvent: 0.1 M NaNO$_3$ aqueous solution Temperature: 40° C.

Detector: RI

Flow rate: 1.0 mL/min

Sample concentration: 0.5 g/L

1. Polymer Synthesis

Synthesis Example 1A

In a 4-neck 1-L round-bottom flask equipped with a stirrer, a thermometer, and a nitrogen introduction tube, pure water (200 g), acrylic acid (50.8 g) (hereinafter, also referred to as "AA"), 4,4'-azobis(4-cyanovaleric acid) (hereinafter, also referred to as "ACVA") (0.035 g) as an initiator, 3-((((1-carboxyethyl)thio)carbonothioyl)thio)propanoic acid (1.29 g) (manufactured by BORON MOLECULAR, hereinafter also referred to as "BM1429") as a RAFT agent were placed and sufficiently degassed by nitrogen bubbling, and polymerization was started in a constant temperature bath at 70° C. After 4 hours, the reaction was stopped by cooling with water. Subsequently, pure water (180 g), acrylamide (50.8 g) (hereinafter, also referred to as "AAm"), and ACVA (0.045 g) were placed and sufficiently degassed by nitrogen bubbling, and polymerization was started in a constant temperature bath at 70° C. After 4 hours, the reaction was stopped by cooling with water. The polymerization rate of AA and the polymerization rate of AAm were each determined from gas chromatography (GC) measurement and found to be 97% and 95%, respectively. The molecular weights of the obtained water-soluble block copolymer (referred to as "polymer A1") were Mn22700 and Mw27200 as measured by GPC, and the PDI was 1.2.

Synthesis Examples 2A to 4A and 6A to 10A

The same operation as in Synthesis Example 1A was carried out except that the raw materials to be placed were changed as shown in Table 1, to obtain water-soluble block copolymers (polymers B1 to D1 and F1 to J1). The results obtained by GPC measurement of the molecular weights of each polymer are shown in Table 2.

Synthesis Example 5A

In a 4-neck 1-L round-bottom flask equipped with a stirrer, a thermometer, and a nitrogen introduction tube, methanol (240 g), AA (63.0 g), N-t-butylacrylamide (hereinafter, also referred to as "TBAM") (12.6 g), 2,2'-azobis (2,4-dimethylvaleronitrile) (manufactured by Wako Pure Chemical Industries, Ltd., hereinafter also referred to as "V-65") (0.450 g) as an initiator, and BM1429 (0.722 g) were placed and sufficiently degassed by nitrogen bubbling, and polymerization was started in a constant temperature bath at 55° C. After 6 hours, the reaction was stopped by cooling with water. The solvent was removed using an evaporator, pure water (400 g) was added, and the precipitated V-65 and unreacted TBAM were recovered by filtration. Subsequently, AAm (40.3 g) and ACVA (0.0475 g) were placed and sufficiently degassed by nitrogen bubbling, and polymerization was started in a constant temperature bath at 70° C. After 4 hours, the reaction was stopped by cooling with water. The polymerization rates of the monomers of AA and TBAM and the polymerization rate of AAm were each determined from GC measurement and found to be 95% and 89%, respectively. The molecular weights of the obtained water-soluble block copolymer (referred to as "polymer E1") were Mn10900 and Mw16400 as measured by GPC, and the PDI was 1.5.

Comparative Synthesis Example 1A

In a 4-neck 1-L round-bottom flask equipped with a stirrer, a thermometer, and a nitrogen introduction tube, pure water (400 g), AAm (50.5 g), 2-acrylamido-2-methylpropanesulfonic acid (hereinafter, also referred to as "ATBS") (50.5 g), ACVA (0.112 g), and BM1429 (2.57 g) were placed and sufficiently degassed by nitrogen bubbling, and polymerization was started in a constant temperature bath at 70° C. After 4 hours, the reaction was stopped by cooling with water. The polymerization rate of AAm and the polymerization rate of ATBS were each determined from GC measurement and NMR measurement, and the overall reaction rate was 89%. The molecular weights of the obtained random copolymer (referred to as "polymer K1") were Mn6790 and Mw11500 as measured by GPC, and the PDI was 1.7.

Comparative Synthesis Examples 2A and 3A

The same operation as in Comparative Synthesis Example 1A was carried out except that the raw materials to be placed were changed as shown in Table 1, to obtain each of polymers L1 and M1. The results obtained by GPC measurement of the molecular weights of each polymer are shown in Table 2.

Comparative Synthesis Example 4A

In a 4-neck 1-L round-bottom flask equipped with a stirrer, a thermometer, and a nitrogen introduction tube, methanol (330 g), TBAM (8.27 g), ATBS (74.4 g), V-65 (0.496 g), and BM1429 (1.75 g) were placed and sufficiently degassed by nitrogen bubbling, and polymerization was started in a constant temperature bath at 55° C. After 6 hours, the reaction was stopped by cooling with water. The polymerization rate of TBAM and the polymerization rate of ATBS were each determined from GC measurement and NMR measurement, and the overall reaction rate was 85%. The molecular weights of the obtained random copolymer (referred to as "polymer N1") were Mn11900 and Mw21400 as measured by GPC, and the PDI was 1.8.

TABLE 1

| | | | Synthesis Example 1A | Synthesis Example 2A | Synthesis Example 3A | Synthesis Example 4A | Synthesis Example 5A | Synthesis Example 6A | Synthesis Example 7A | Synthesis Example 8A |
|---|---|---|---|---|---|---|---|---|---|---|
| | Polymer name | | A1 | B1 | C1 | D1 | E1 | F1 | G1 | H1 |
| 1st | Monomer [g] | AAm | | 20.8 | | | | | | 15.2 |
| | | AA | 50.8 | | | | 63.0 | | | |
| | | ATBS | | 20.8 | | | | | | 75.8 |
| | | ACMO | | | 18.8 | 50.6 | | 81.4 | | |
| | | HEA | | | | | | | 50.8 | |
| | | MA | | | | | | | | |
| | | TBAM | | | | | 12.6 | | | |
| | Initiator [g] | ACVA | 0.035 | 0.082 | 0.013 | 0.035 | | 0.056 | 0.021 | 0.102 |
| | | V-65 | | | | | 0.450 | | | |
| | Solvent [g] | Pure water | 200 | 200 | 75 | 200 | | 325 | 200 | 365 |
| | | MeOH | | | | | 240 | | | |
| | RAFT agent [g] | BM1429 | 1.29 | 0.52 | 1.20 | 5.14 | 0.722 | 2.58 | 2.58 | 0.10 |
| | Polymerization rate [%] | | 97 | 86 | 97 | 97 | 95 | 98 | 99 | 95 |
| 2nd | Monomer [g] | AAm | 50.8 | | | | 40.3 | | | |
| | | AA | | 41.6 | | | | | 50.8 | 10.1 |
| | | ATBS | | | 75.2 | 50.6 | | 20.4 | | |
| | Initiator [g] | ACVA | 0.045 | 0.014 | 0.100 | 0.115 | 0.0475 | 0.073 | 0.055 | 0.019 |
| | Solvent [g] | Pure water | 180 | 200 | 330 | 200 | 400 | 80 | 200 | 40 |
| | Polymerization rate [%] | | 95 | 98 | 85 | 86 | 89 | 83 | 98 | 98 |

| | | | Synthesis Example 9A | Synthesis Example 10A | Comparative Synthesis Example 1A | Comparative Synthesis Example 2A | Comparative Synthesis Example 3A | Comparative Synthesis Example 4A |
|---|---|---|---|---|---|---|---|---|
| | Polymer name | | I1 | J1 | K1 | L1 | M1 | N1 |
| 1st | Monomer [g] | AAm | 5.00 | | 50.5 | | 92.0 | |
| | | AA | 85.8 | 81.3 | | 58.8 | 10.2 | |
| | | ATBS | | | 50.5 | | | 74.4 |
| | | ACMO | | | | | | |
| | | HEA | | | | | | |
| | | MA | | | | 25.0 | | |
| | | TBAM | | | | | | 8.27 |
| | Initiator [g] | ACVA | 0.063 | 0.056 | 0.112 | | 0.070 | |
| | | V-65 | | | | 0.498 | | 0.496 |
| | Solvent [g] | Pure water | 360 | 323 | 400 | | 410 | |
| | | MeOH | | | | 335 | | 330 |
| | RAFT agent [g] | BM1429 | 2.18 | 2.58 | 2.57 | 0.71 | 0.87 | 1.75 |
| | Polymerization rate [%] | | 95 | 94 | 89 | 95 | 95 | 85 |
| 2nd | Monomer [g] | AAm | 10.1 | 20.3 | | | | |
| | | AA | | | | | | |
| | | ATBS | | | | | | |

TABLE 1-continued

| | | | |
|---|---|---|---|
| Initiator [g] | ACVA | 0.080 | 0.030 |
| Solvent [g] | Pure water | 40 | 80 |
| Polymerization rate [%] | | 98 | 95 | — | — | — | — |

The abbreviations of the compounds in Table 1 are as follows.
AAm: Acrylamide
AA: Acrylic acid
ATBS: 2-Acrylamido-2-methylpropanesulfonic acid
ACMO: 4-acryloylmorpholine
HEA: 2-hydroxyethyl acrylate
MA: Methyl acrylate
TBAM: N-t-Butylacrylamide
ACVA: 4,4'-Azobis(4-cyanovaleric acid)
V-65: 2,2'-Azobis(2,4-dimethylvaleronitrile)
MeOH: Methanol
BM1429: 3-((((1-Carboxyethyl)thio)carbonothioyl)thio) propanoic acid
2. Measurement and Evaluation

Example 1A

As a dispersant, a polymer aqueous solution including polymer A1 at a solid concentration of 20% was provided. 4.0 g of a ceria nanoparticle (primary particle size of 20 nm) and 2 g of the dispersant was added to a 50-mL glass pressure resistant bottle and mixed well, and the pH was adjusted to pH 7 using a 0.5 mol/L HCl solution or a 25% by mass $NH_3$ aqueous solution. Then, 20 g of a zirconia bead having a diameter of 1 mm was added, and the resulting mixture was stirred using a paint shaker for 30 minutes. The bead was removed by filtration and then the remainder was allowed to stand overnight to obtain a slurry-like polishing agent composition. The following measurement and evaluation were carried out using the obtained polishing agent composition. Results of the measurement and the evaluation are shown in Table 2.
<Slurry Viscosity>
The shear viscosity [mPa·s] of the prepared polishing agent composition was measured under the following conditions.
○Measurement Conditions
Apparatus body: Physical MCR301 manufactured by Anton Paar GmbH
Measurement temperature: 25° C.
Shear rate range: 1 [s$^{-1}$] to 1000 [s$^{-1}$]

It can be deemed that the smaller the value of the slurry viscosity, the less likely the aggregation of the ceria particle due to a shear force to occur and the better the dispersion stability. The particle that had been allowed to stand overnight and settled was redispersed by shaking the container by hand, and the viscosity of the polishing agent composition in the redispersed state was measured.
<Slurry Appearance>
The appearance of the slurry was determined by visually confirming the appearance of the prepared polishing agent composition. First, a slurry-like polishing agent composition was prepared as a reference sample by carrying out the same operation as in Example 1A except that no dispersant was added. This reference sample was left to stand for 24 hours to measure the settling thickness D, and the degree of settling [%] of the particle of each polishing agent composition was calculated with the measured settling thickness D as 100%, to carry out the determination. The determination criteria are as follows. The particle that had been allowed to stand overnight and settled was redispersed by shaking the container by hand, and the particle settling within 1 hour after the redispersion was confirmed.
⊙: Particle settling within 1 hour was 5% or less
○: Particle settling within 1 hour was more than 5% and 15% or less
Δ: Particle settling within 1 hour was more than 15% and 30% or less
x: Particle settling within 1 hour was more than 30%

Examples 2A to 10A and Comparative Examples 1A to 4A

Dispersants were each provided in the same manner as in Example 1A except that the polymers used were changed as shown in Table 2, and slurry-like polishing agent compositions were each prepared by the same operations as in Example 1A. The obtained polishing agent compositions were measured for slurry viscosity and evaluated for slurry appearance in the same manner as in Example 1A. Results are shown in Table 2.

TABLE 2

| | | Poly-mer name | Polymer block A | | | | Polymer block B | | | | A/B mass ratio | | Mn of each block | | Polymer/molecular weight physical properties | | | Slurry appear-ance | Slurry viscosity [mPa · s] |
|---|---|---|---|---|---|---|---|---|---|---|---|---|---|---|---|---|---|---|---|
| | | | Monomer 1 | | Monomer 2 | | Monomer 1 | | Monomer 2 | | A | B | A | B | Mn | Mw | PDI | | |
| Exam-ples | 1A | A1 | AAm | 50 | — | — | AA | 50 | — | — | 50 | 50 | 10000 | 10000 | 22700 | 27200 | 1.2 | ⊙ | 8.3 |
| | 2A | B1 | AAm | 25 | ATBS | 25 | AA | 50 | — | — | 50 | 50 | 10000 | 10000 | 18900 | 24600 | 1.3 | ⊙ | 7.5 |
| | 3A | C1 | ACMO | 20 | — | — | ATBS | 80 | — | — | 20 | 80 | 2000 | 8000 | 8830 | 12400 | 1.4 | ⊙ | 15 |
| | 4A | D1 | ACMO | 50 | — | — | ATBS | 50 | — | — | 50 | 50 | 2500 | 2500 | 3690 | 5170 | 1.4 | ⊙ | 18 |
| | 5A | E1 | AAm | 40 | — | — | AA | 50 | TBAM | 10 | 40 | 60 | 4000 | 6000 | 10900 | 16400 | 1.5 | ⊙ | 20 |
| | 6A | F1 | ACMO | 80 | — | — | ATBS | 20 | — | — | 80 | 20 | 8000 | 2000 | 8960 | 11600 | 1.3 | ○ | 27 |
| | 7A | G1 | HEA | 50 | — | — | AA | 50 | — | — | 50 | 50 | 3000 | 7000 | 20400 | 24500 | 1.2 | ○ | 28 |
| | 8A | H1 | AAm | 15 | ATBS | 75 | AA | 10 | — | — | 90 | 10 | 90000 | 10000 | 116000 | 209000 | 1.8 | Δ | 30 |

TABLE 2-continued

| Poly-mer name | Polymer block A Monomer 1 | Polymer block A Monomer 2 | Polymer block B Monomer 1 | Polymer block B Monomer 2 | A/B mass ratio A | A/B mass ratio B | Mn of each block A | Mn of each block B | Polymer/molecular weight physical properties Mn | Polymer/molecular weight physical properties Mw | Polymer/molecular weight physical properties PDI | Slurry appear-ance | Slurry viscosity [mPa · s] |
|---|---|---|---|---|---|---|---|---|---|---|---|---|---|
| 9A  I1 | AAm 10 | — — | AA 85 | AAm 5 | 10 | 90 | 10000 | 90000 | 163000 | 196000 | 1.2 | Δ | 31 |
| 10A  J1 | AAm 80 | — — | AA 20 | — — | 80 | 20 | 8000 | 2000 | 13300 | 16000 | 1.2 | Δ | 35 |
| Compar-ative 1A  K1 | AAm 50 | ATBS 50 | — — | — — | 100 | — | 10000 | — | 6790 | 11500 | 1.7 | X | 42 |
| ative 2A  L1 | AA 70 | MA 30 | — — | — — | 100 | — | 30000 | — | 42000 | 84000 | 2 | X | 44 |
| Exam-ples 3A  M1 | AAm 90 | AA 10 | — — | — — | 100 | — | 30000 | — | 25200 | 27700 | 1.1 | X | 45 |
| ples 4A  N1 | ATBS 90 | TBAM 10 | — — | — — | 100 | — | 12000 | — | 11900 | 21400 | 1.8 | X | 46 |

In Table 2, the numerical values of monomer 1 and monomer 2 in the "Polymer block A" column and the "Polymer block B" column represent the monomer composition (mass ratio) of each polymer calculated from the amounts of the monomers placed at the time of polymerization. The "A/B Mass ratio" represents the ratio (mass ratio) of the polymer block A and the polymer block B in each polymer calculated from the monomer composition of each polymer. The numerical values in the "Mn of each block" column are design values of Mn of each polymer block A and polymer block B, and the Mn, Mw, and PDI in the "Polymer/molecular weight physical properties" column are measured values by GPC measurement.

As is clear from the results of Examples 1A to 10A, by using the block copolymer (P) having the polymer block A and the polymer block B as the dispersant, a slurry in which the ceria particle was less likely to settle and the ceria particle was stably dispersed in the system was able to be obtained. In addition, it was found that the slurry containing the block copolymer (P) had a low slurry viscosity of 35 mPa·s or less, and that the aggregation of the ceria particle due to a shear force was less likely to occur. In particular, in Example 5A in which the polymer block B used polymer E1 having a monomer unit derived from TBAM, settling of the particle was less likely to occur and the slurry viscosity also had a smaller value than in Examples 9A and 10A using polymers I1 and J1, respectively, having no monomer unit derived from TBAM.

On the other hand, in Comparative Examples 1A to 4A in which the random copolymer was used instead of the block copolymer (P), the degree of settling of the ceria particle was large. In addition, the slurry viscosity was as large as 42 mPa·s or more, and the result was that the dispersion stability of the ceria particle was inferior.

Second Embodiment

Next, the dispersant and the polishing agent composition of a second embodiment will be described. In the following description, for the sake of simplification of the description, for a portion that is the same as the first embodiment described above, the above description in the first embodiment will be referred to.

<<Dispersant>>

The dispersant in the second embodiment contains, as a water-soluble polymer, a block copolymer (P) having a polymer block A having a structural unit having an ionic functional group and a polymer block B having a structural unit having an ionic functional group that is a segment having a monomer composition different from that of the polymer block A. In the following, the structural unit having an ionic functional group of the polymer block A is also referred to as the "structural unit UA-2", and the structural unit having an ionic functional group of the polymer block B is also referred to as the "structural unit UB-2".

<Block copolymer (P)>
Polymer Block A

The ionic functional group of the structural unit UA-2 is preferably a carboxyl group, a sulfonic acid group, a phosphoric acid group, a phosphonic acid group, an amino group, or a salt thereof in that appropriate adsorptivity to an abrasive grain (particularly cerium oxide) is exhibited and that good dispersion stability can be imparted to the abrasive grain. Among them, the ionic functional group is preferably an anionic functional group such as a carboxyl group, a sulfonic acid group, a phosphoric acid group, or a phosphonic acid group, or a salt thereof, and is particularly preferably a carboxyl group, a sulfonic acid group, or a salt thereof.

The structural unit UA-2 is preferably introduced into the block copolymer (P) by polymerization using a monomer having an ionic functional group (hereinafter, also referred to as an "ionic group-containing monomer"). The ionic group-containing monomer is preferably a vinyl monomer in that the adsorptivity to an abrasive grain and an object to be polished having a hydrophobic surface is good and that the degree of freedom in selecting the monomer is high. The block copolymer (P) having a main chain consisting of a carbon-carbon bond has high adsorptivity to an abrasive grain, and also appropriately adsorbs to an object to be polished having a hydrophobic surface, and can impart good wettability to the polishing surface. The ionic group-containing monomer is preferably a water-soluble monomer from the viewpoint of obtaining a polymer having high solubility in an aqueous system. The "water-soluble monomer" refers to a compound having a solubility of 2 g or more in 100 g of water at 20° C.

For the description of specific examples of the ionic group-containing monomer that can be used in the production of the block copolymer (P) of the present embodiment and the counter ion when the ionic functional group is a salt, the examples of the ionic group-containing monomer and the counter ion described in the polymer block B of the block copolymer (P) in the first embodiment can be referred to.

The polymer block A may be a block consisting only of the structural unit UA-2, and may further have a structural unit derived from a monomer different from the ionic group-containing monomer (hereinafter, also referred to as "another monomer M1-2") as long as the action of the block copolymer (P) is not impaired.

Another monomer M1-2 is not particularly limited as long as it is a monomer copolymerizable with the ionic group-containing monomer, and among such monomers, at least one selected from the group consisting of an amide group-containing vinyl monomer and an ester group-containing vinyl monomer is preferable. As specific examples thereof, examples of the amide group-containing vinyl monomer include a (di)alkyl(meth)acrylamide, a (di)alkylaminoalkylamide, a heterocyclic ring-containing (meth)acrylamide, a hydroxyl group-containing (meth)acrylamide, and an N-vinylamide, which are given as examples of the amide group-containing vinyl monomer constituting the structural unit UA of the polymer block A in the first embodiment described above.

Specific examples when another monomer M1-2 is an ester group-containing vinyl monomer include a (meth)acrylic acid alkyl ester, an aliphatic cyclic ester of (meth)acrylic acid, an aromatic ester of (meth)acrylic acid, an alkoxyalkyl (meth)acrylate, a (di)alkylaminoalkyl (meth)acrylate, an epoxy group-containing (meth)acrylic acid ester, and a polyoxyalkylene (meth)acrylate, which are given as examples of the ester group-containing vinyl monomer constituting the structural unit UA of the polymer block A in the first embodiment described above. As another monomer M1-2, these can be used singly or in combinations of two or more.

The polymer block A may include, together with the structural unit UA-2, a structural unit having an alkyl group having 1 to 10 carbon atoms in a side chain moiety (structural unit UC). The polymer block A that has a structural unit UC is preferable in that the hydrophobicity of the polymer block A is enhanced and that the adsorptivity to an abrasive grain (particularly cerium oxide) can be further improved. The alkyl group which the structural unit UC has in a side chain moiety preferably has 2 or more carbon atoms from the viewpoint of further enhancing the dispersion stability of an abrasive grain. The upper limit of the number of carbon atoms of the alkyl group which the structural unit UC has in a side chain moiety is preferably 8 or less, and more preferably 7 or less, from the viewpoint of obtaining a polymer having high solubility in an aqueous system. The alkyl group is preferably bonded to the main chain via a linking group (—COO—, —CONH—, or the like).

The monomer constituting the structural unit UC is preferably at least one selected from the group consisting of an ester group-containing vinyl monomer and an amide group-containing vinyl monomer. Among these, at least one selected from the group consisting of a (meth)acrylic acid alkyl ester in which the alkyl group of the alkyl ester moiety has 1 to 10 carbon atoms and an N-alkyl(meth)acrylamide in which the N-alkyl group has 1 to 10 carbon atoms is preferable, and at least one selected from the group consisting of a (meth)acrylic acid alkyl ester in which the alkyl group of the alkyl ester moiety has 2 to 10 carbon atoms and an N-alkyl(meth)acrylamide in which the N-alkyl group has 2 to 10 carbon atoms is more preferable, in that the effect of improving the dispersion stability of an abrasive grain is high. The polymer block A may have only one structural unit UC, or may have two or more.

In the polymer block A, the content of the structural unit UA-2 having an ionic functional group is preferably 30% by mass or more based on all the constituent monomer units of the polymer block A. A content of the structural unit UA-2 of 30% by mass or more is preferable in that the dispersion stability of an abrasive grain can be further enhanced. From this viewpoint, the content of the structural unit UA-2 is more preferably 40% by mass or more, further preferably 50% by mass or more, and more further preferably 60% by mass or more, based on all the constituent monomer units of the polymer block A. When a structural unit derived from another monomer is introduced, the upper limit of the content of the structural unit UA-2 is preferably 99% by mass or less, more preferably 98% by mass or less, and further preferably 96% by mass or less, based on all the constituent monomer units of the polymer block A.

The content of the structural unit UC is preferably 1% by mass or more, more preferably 2% by mass or more, and further preferably 4% by mass or more, based on all the constituent monomer units of the polymer block A from the viewpoint of improving the adsorptivity to an abrasive grain and sufficiently obtaining the effect of improving the dispersion stability of the abrasive grain. The upper limit of the content of the structural unit UC is preferably 70% by mass or less, more preferably 60% by mass or less, and further preferably 50% by mass or less, based on all the constituent monomer units of the polymer block A.

The number average molecular weight (Mn) of the polymer block A is preferably in the range of 1,000 or more and 100,000 or less. An Mn of 1,000 or more is preferable in that the effect of improving the dispersion stability of an abrasive grain by introducing the polymer block A is sufficiently developed. In addition, an Mn of 100,000 or less is preferable in that the formation of an aggregation structure of an abrasive grain by adsorbing one molecule of the polymer on the surfaces of a plurality of abrasive grains can be sufficiently suppressed. The Mn of the polymer block A is more preferably 1,500 or more, further preferably 2,000 or more, and more further preferably 3,000 or more. In addition, the Mn of the polymer block A is more preferably 70,000 or less, further preferably 50,000 or less, and particularly preferably 30,000 or less. The number average molecular weight (Mn) and the weight average molecular weight (Mw) of the polymer are values in terms of sodium polyacrylate measured by GPC. More specifically, these are values measured by the method described in Examples described later.

Polymer Block B

Examples of the ionic functional group of the structural unit UB-2 include functional groups which are given as examples of the ionic functional group of the structural unit UA-2. Among them, the ionic functional group of the structural unit UB-2 is preferably an anionic functional group such as a carboxyl group, a sulfonic acid group, a phosphoric acid group, or a phosphonic acid group, or a salt thereof, and is particularly preferably a carboxyl group, a sulfonic acid group, or a salt thereof. In addition, the structural unit UB-2 is preferably introduced into the block copolymer (P) by polymerization using an ionic group-containing monomer. The description of the polymer block A is applied to specific examples and preferable examples of the ionic group-containing monomer.

For the ionic functional groups of the polymer block A and the polymer block B, the block copolymer (P) satisfies the following condition I, condition II, or both.

Condition I: The ionic functional group of the polymer block A and the ionic functional group of the polymer block B are different from each other.

Condition II: The content of the ionic functional group of the polymer block A and the content of the ionic functional group of the polymer block B are different from each other.

For the above condition I, the combination of the ionic functional group of the polymer block A and the ionic functional group of the polymer block B is not particularly limited. When the polymer block A and/or the polymer block B has a plurality of ionic functional groups, at least one of the ionic functional groups of each polymer block may be a different ionic functional group. Preferable specific examples of a combination satisfying condition I include the following examples [1] to [3].

[1] An example in which one of the polymer block A and the polymer block B has a sulfonic acid group and the other has a carboxyl group.

[2] An example in which one of the polymer block A and the polymer block B has a sulfonic acid group and a carboxyl group, and the other has a carboxyl group.

[3] An example in which one of the polymer block A and the polymer block B has a sulfonic acid group and a carboxyl group, and the other has a sulfonic acid group.

When the block copolymer (P) satisfies only condition I, the ratio of the content of the structural unit having an ionic functional group in the polymer block A to the content of the structural unit having an ionic functional group in the polymer block B is preferably 1/99 to 99/1, more preferably 5/95 to 95/5, and further preferably 10/90 to 90/10 by mass ratio. A ratio within the above range is preferable in that the adsorptivity to an abrasive grain is appropriately regulated, that an appropriate electrostatic repulsive force is imparted to the entire block copolymer (P), and that the effect of suppressing the formation of an aggregation structure of the abrasive grain due to a shear force can be enhanced.

When the above condition II is satisfied, the content of the structural unit UA-2 in the polymer block A and the content of the structural unit UB-2 in the polymer block B may be different. For the content of the structural unit UA-2 in the polymer block A and the content of the structural unit UB-2 in the polymer block B, based on a content of one of these of 100 parts by mass, the content of the other is preferably 99 parts by mass or less, more preferably 98 parts by mass or less, and further preferably 96 parts by mass or less. Within the above range, the difference in the adsorptivity to an abrasive grain and an object to be polished can be made larger between the polymer block A and the polymer block B, and the formation of an aggregation structure of the abrasive grain due to a shear force can be suitably suppressed. Based on one of the contents of the structural unit UA-2 and the content of the structural unit UB-2 being 100 parts by mass, the lower limit of the content of the other is preferably 2 parts by mass or more, more preferably 5 parts by mass or more, and further preferably 10 parts by mass or more.

For the content of the structural unit derived from the ionic group-containing monomer, any block of the polymer block A and the polymer block B may be increased. From the viewpoint of obtaining a polymer having higher dispersion stability of an abrasive grain, the content of the structural unit derived from the ionic group-containing monomer in the polymer block B is preferably made higher than that of the polymer block A having the structural unit UC.

The polymer block B may include a structural unit (that is, a structural unit UC) having an alkyl group having 1 to 10 carbon atoms in a side chain moiety, and the polymer block B preferably does not substantially have a structural unit UC in that the difference in the adsorptivity to an abrasive grain and an object to be polished within one molecule of the polymer can be made larger and that the formation of an aggregation structure of the abrasive grain due to a shear force can be further suppressed. Specifically, in the polymer block B, the content of the structural unit UC is preferably 0% by mass or more and 10% by mass or less, more preferably 0% by mass or more and 5% by mass or less, and further preferably 0% by mass or more and 1% by mass or less, based on all the constituent monomer units of the polymer block B.

The number average molecular weight (Mn) in terms of sodium polyacrylate measured by GPC of the polymer block B is preferably in the range of 1,000 or more and 100,000 or less. An Mn of 1,000 or more is preferable in that the effect of improving the dispersion stability of an abrasive grain by introducing the polymer block B is sufficiently developed. In addition, an Mn of 100,000 or less is preferable in that the formation of an aggregation structure of an abrasive grain by adsorbing one molecule of the polymer on the surfaces of a plurality of abrasive grains can be sufficiently suppressed. The Mn of the polymer block B is more preferably 1,500 or more, further preferably 2,000 or more, and more further preferably 3,000 or more. In addition, the Mn of the polymer block B is more preferably 70,000 or less, further preferably 50,000 or less, and particularly preferably 40,000 or less.

<Production of Block Copolymer (P)>

The block copolymer (P) of the present embodiment is not particularly limited in the method for producing the same as long as a block copolymer having two or more different segments can be obtained, and can be produced by adopting a known production method. For a specific description of a method for producing the block copolymer (P), the above description in the first embodiment can be referred to. As a method for producing the block copolymer (P), the living radical polymerization method having a degenerative chain transfer mechanism or a bond-dissociation mechanism is preferable, the RAFT method or the NMP method is more preferable, and the RAFT method is particularly preferable, as in the first embodiment.

The number average molecular weight (Mn) in terms of sodium polyacrylate measured by GPC of the block copolymer (P) of the present embodiment is preferably in the range of 2,000 or more and 200,000 or less. An Mn of 2,000 or more is preferable in that a decrease in the polishing rate can be suppressed while the wettability of the surface of an object to be polished is sufficiently secured. In addition, an Mn of 200,000 or less is preferable in that the aggregation of an abrasive grain due to a shear force can be sufficiently suppressed and that the occurrence of a defect such as a scratch can be sufficiently suppressed during polishing. From these viewpoints, the Mn of the block copolymer (P) is more preferably 2,500 or more, further preferably 3,000 or more, and more further preferably 4,000 or more. The upper limit of the Mn of the block copolymer (P) is more preferably 100,000 or less, further preferably 80,000 or less, more further preferably 70,000 or less, and particularly preferably 60,000 or less.

The weight average molecular weight (Mw) in terms of sodium polyacrylate measured by GPC of the block copolymer (P) is preferably in the range of 3,000 or more and 250,000 or less. The Mw of the block copolymer (P) is more preferably 4,000 or more, further preferably 6,000 or more, and more further preferably 10,000 or more. The upper limit of the Mw of the block copolymer (P) is more preferably 150,000 or less, further preferably 120,000 or less, and more further preferably 80,000 or less.

The molecular weight dispersity (PDI=(Mw/Mn)) represented by the ratio of the weight average molecular weight Mw to the number average molecular weight Mn of the block copolymer (P) is preferably 2.5 or less. It is considered that the magnitude of the molecular weight of a polymer exhibiting the dispersion function of an abrasive grain affects the rate of adsorption to/desorption from an object to be polished, and it is generally considered that the smaller the molecular weight of the polymer, the higher the rate of adsorption to/desorption from the object to be polished. In addition, it is considered that a polymer having a large molecular weight is likely to form an aggregation structure of an abrasive grain due to a shear force. Because of this, the polymer used for an application as a dispersant for an abrasive grain preferably has a narrow molecular weight distribution. From these viewpoints, the PDI of the block copolymer (P) is more preferably 2.2 or less, further preferably 2.0 or less, and more further preferably 1.7 or less. The lower limit of the PDI is usually 1.0.

The ratio A/B (mass ratio) of the polymer block A and the polymer block B in one molecule of the block copolymer (P) is preferably 5/95 to 95/5, from the viewpoint of suppressing the formation of an aggregation structure of an abrasive grain due to a shear force. The ratio A/B is more preferably 10/90 to 90/10, further preferably 15/85 to 85/15, more further preferably 20/80 to 80/20, and particularly preferably 25/75 to 75/25. The ratio A/B can be appropriately selected by adjusting the ratio of the monomer used for producing the polymer block A to the monomer used for producing the polymer block B.

As long as the block copolymer (P) has the polymer block A and the polymer block B, the numbers, the arrangement order, and the like of the polymer block A and the polymer block B in one molecule are not particularly limited. For specific examples of a block structure in the block copolymer (P), the above description in the first embodiment can be referred to. Of these, the block copolymer (P) of the present embodiment is preferably a diblock copolymer having an AB-type structure in that a block copolymer (P) having sufficiently high dispersion stability of an abrasive grain (particularly cerium oxide) can be efficiently produced.

The dispersant of the present embodiment may be any one containing the block copolymer (P). Therefore, the dispersant may be in a form consisting of a single component containing only the block copolymer (P), or may be in a form including a component different from the block copolymer (P) ("another component") together with the block copolymer (P).

The dispersant of the present embodiment can include a solvent as another component. Examples of the solvent include water, an organic solvent, and a mixed solvent of water and an organic solvent. Of these, the solvent contained in the dispersant is preferably a solvent that can dissolve the block copolymer (P), which is a water-soluble polymer, more preferably a water or a mixed solvent of water and an organic solvent soluble in water, and particularly preferably water. For specific examples of the organic solvent used with water, the above description in the first embodiment can be referred to. As the organic solvent, one alone can be used or two or more can be used in combination.

When the dispersant contains a block copolymer (P) and a solvent, the content of the block copolymer (P) is preferably 1% by mass or more, more preferably 5% by mass or more, and further preferably 10% by mass or more, based on the total mass of the block copolymer (P) and the solvent, from the viewpoint of sufficient contact between the surface of an object to be polished and a polishing pad and the block copolymer (P). In addition, the upper limit of the content of the block copolymer (P) is preferably 70% by mass or less, more preferably 60% by mass or less, and further preferably 50% by mass or less, based on the total mass of the block copolymer (P) and the solvent from the viewpoint of suppressing the deterioration of handleability due to excessively high viscosity.

<<Polishing Agent Composition>>

The polishing agent composition of the present embodiment contains cerium oxide (ceria) as an abrasive grain and the above dispersant. Cerium oxide has the following advantages: a polishing surface can be polished at a higher polishing rate than that in the case of silica, alumina, and the like, and the hardness is lower than that of alumina and the like and the occurrence of a defect on the polishing surface can be suppressed. For the description of cerium oxide used, the content of cerium oxide in the polishing agent composition, the solvent, the method for preparing the polishing agent composition, and the like, the above description in the first embodiment can be referred to.

The polishing agent composition of the present embodiment contains a block copolymer (P) as a dispersant, and thus the dispersion stability of an abrasive grain (particularly a ceria particle) is high, and the effect of suppressing the aggregation of the abrasive grain due to a shear force is high. Therefore, the polishing agent composition of the present embodiment is preferable in that by being used as a polishing liquid for an application flattening the surface of an insulating film, a metal wiring, or both in the production step of a semiconductor element, specifically, for example for flattening an oxide film (a silicon oxide film or the like) during shallow trench isolation (STI) creation, flattening the surface of a metal wiring made of copper, a copper alloy, an aluminum alloy, or the like, or flattening the surface of an interlayer insulating film (oxide film), the occurrence of a defect is reduced and an insulating film and a metal wiring having excellent surface smoothness can be obtained.

Example 2

Hereinafter, the present embodiment will be specifically described with reference to Examples, but the present disclosure is not limited to these Examples. In the following, "parts" and "%" mean "parts by mass" and "% by mass", respectively, unless otherwise specified. The molecular weight of a polymer is a value in terms of sodium polyacrylate measured by GPC using the same conditions as in [Example 1] of the first embodiment described above.

1. Polymer Synthesis

Synthesis Example 1B

In a 4-neck 1-L round-bottom flask equipped with a stirrer, a thermometer, and a nitrogen introduction tube, pure water (200 g), acrylic acid (50.2 g) (hereinafter, also referred to as "AA"), 4,4'-azobis(4-cyanovaleric acid) (hereinafter, also referred to as "ACVA") (0.056 g) as an initiator, 3-((((1-carboxyethyl)thio)carbonothioyl)thio)propanoic acid (2.55 g) (manufactured by BORON MOLECULAR, hereinafter also referred to as "BM1429") as a RAFT agent were placed and sufficiently degassed by nitrogen bubbling, and polymerization was started in a constant temperature bath at 70° C. After 4 hours, the reaction was stopped by cooling with water. Subsequently, pure water (200 g), 2-acrylamido-2-methylpropanesulfonic acid (50.2 g) (hereinafter, also referred to as "ATBS"), and ACVA (0.072 g) were placed and sufficiently degassed by nitrogen bubbling, and polymerization was started in a constant temperature bath at 70° C. After 4 hours, the reaction was stopped by cooling with water. The polymerization rate of AA and the polymerization rate of ATBS were determined from gas chromatography (GC) measurement and NMR measurement and found to be 97% and 85%, respectively. The molecular weights of the obtained water-soluble block copolymer (referred to as "polymer A2") were Mn9650 and Mw12500 as measured by GPC, and the PDI was 1.3.

Synthesis Example 2B

In a 4-neck 1-L round-bottom flask equipped with a stirrer, a thermometer, and a nitrogen introduction tube, methanol (165 g), AA (33.2 g), N-t-butylacrylamide (8.31 g) (hereinafter, also referred to as "TBAM"), 2,2'-azobis(2,4-dimethylvaleronitrile) (manufactured by Wako Pure Chemical Industries, Ltd., hereinafter also referred to as "V-65") (0.497 g) as an initiator, and BM1429 (2.11 g) were placed and sufficiently degassed by nitrogen bubbling, and polymerization was started in a constant temperature bath at 55° C. After 6 hours, the reaction was stopped by cooling with water. Subsequently, the solvent was removed using an evaporator, pure water (425 g) was added, and the precipitated V-65 and unreacted TBAM were recovered by filtration. Subsequently, the total amount of the filtrate, AA (37.4 g), ATBS (4.20 g), and ACVA (0.056 g) were placed and sufficiently degassed by nitrogen bubbling, and polymerization was started in a constant temperature bath at 70° C. After 4 hours, the reaction was stopped by cooling with water. The polymerization rate of AA/TBAM and the polymerization rate of AA/ATBS were determined from GC measurement and found to be 90% and 85%, respectively. The molecular weights of the obtained water-soluble block copolymer (referred to as "polymer B2") were Mn13600 and Mw20400 as measured by GPC, and the PDI was 1.5.

Synthesis Example 3B

In a 4-neck 1-L round-bottom flask equipped with a stirrer, a thermometer, and a nitrogen introduction tube, methanol (190 g), AA (48.2 g), V-65 (0.288 g), and BM1429 (2.11 g) were placed and sufficiently degassed by nitrogen bubbling, and polymerization was started in a constant temperature bath at 55° C. After 6 hours, the reaction was stopped by cooling with water. Subsequently, methanol (190 g), AA (46.3 g), TBAM (1.93 g), and V-65 (0.145 g) were placed and sufficiently degassed by nitrogen bubbling, and polymerization was started in a constant temperature bath at 55° C. After 6 hours, the reaction was stopped by cooling with water. The polymerization rate of AA and the polymerization rate of AA/TBAM were determined from GC measurement and found to be 87% and 90%, respectively. The molecular weights of the obtained water-soluble block copolymer (referred to as "polymer C2") were Mn18900 and Mw24600 as measured by GPC, and the PDI was 1.3.

Synthesis Examples 4B, 5B, and 9B

The same operation as in Synthesis Example 3B was carried out except that the raw materials to be placed were changed as shown in Table 3, to obtain each of water-soluble block copolymers (polymers D2, E2, and I2). The results obtained by GPC measurement of the molecular weights of polymers D2, E2, and 12 are shown in Table 4.

Synthesis Example 6B

In a 4-neck 1-L round-bottom flask equipped with a stirrer, a thermometer, and a nitrogen introduction tube, N,N-dimethylformamide (hereinafter, also referred to as "DMF") (330 g), AA (82.8 g), V-65 (0.213 g), and BM1429 (0.681 g) were placed and sufficiently degassed by nitrogen bubbling, and polymerization was started in a constant temperature bath at 55° C. After 6 hours, the reaction was stopped by cooling with water. Subsequently, DMF (55 g), ATBS (10.6 g), TBAM (3.30 g), and V-65 (0.143 g) were placed and sufficiently degassed by nitrogen bubbling, and polymerization was started in a constant temperature bath at 55° C. After 6 hours, the reaction was stopped by cooling with water. The solvent was removed using an evaporator, and the remainder was adjusted to a 20% aqueous solution using pure water. The polymerization rate of AA and the polymerization rate of ATBS/TBAM were determined from GC measurement and found to be 80% and 82%, respectively. The molecular weights of the obtained water-soluble block copolymer (referred to as "polymer F2") were Mn42500 and Mw72300 as measured by GPC, and the PDI was 1.7.

Synthesis Examples 7B and 8B

The same operation as in Synthesis Example 6B was carried out except that the raw materials to be placed were changed as shown in Table 3, to obtain each of water-soluble block copolymers (polymers G2 and H2). The results obtained by GPC measurement of the molecular weights of polymers G2 and H2 are shown in Table 4.

Comparative Synthesis Example 1B

In a 4-neck 1-L round-bottom flask equipped with a stirrer, a thermometer, and a nitrogen introduction tube, DMF (365 g), ATBS (73.6 g), TBAM (18.4 g), V-65 (0.544 g), and BM1429 (0.936 g) were placed and sufficiently degassed by nitrogen bubbling, and polymerization was started in a constant temperature bath at 55° C. After 6 hours, the reaction was stopped by cooling with water. The polymerization rate of ATBS and the polymerization rate of TBAM were each determined from GC measurement and NMR measurement, and the overall reaction rate was 90%. The molecular weights of the obtained random copolymer (referred to as "polymer J2") were Mn15800 and Mw28400 as measured by GPC, and the PDI was 1.8.

Comparative Synthesis Example 2B

The same operation as in Comparative Synthesis Example 1B was carried out except that the raw materials to be placed were changed as shown in Table 3, to obtain polymer K2. The results obtained by GPC measurement of the molecular weights of polymer K2 are shown in Table 4.

TABLE 3

| | | | Synthesis Example 1B | Synthesis Example 2B | Synthesis Example 3B | Synthesis Example 4B | Synthesis Example 5B | Synthesis Example 6B | Synthesis Example 7B | Synthesis Example 8B | Synthesis Example 9B | Comparative Synthesis Example 1B | Comparative Synthesis Example 2B |
|---|---|---|---|---|---|---|---|---|---|---|---|---|---|
| | Polymer name | | A2 | B2 | C2 | D2 | E2 | F2 | G2 | H2 | I2 | J2 | K2 |
| 1st | Monomer [g] | AA | 50.2 | 33.2 | 48.2 | 66.6 | 41.6 | 82.8 | 47.4 | | 49.8 | | 58.8 |
| | | ATBS | | | | | | | | 47.7 | | 73.6 | |
| | | MA | | | | | | | | | | | 25.0 |
| | | TBAM | | 8.31 | | | | | | | 16.6 | 18.4 | |
| | Initiator [g] | ACVA | 0.056 | | | | | | | | | | |
| | | V-65 | | 0.497 | 0.288 | 0.397 | 0.248 | 0.213 | 0.122 | 0.124 | 0.397 | 0.544 | 0.498 |
| | Solvent [g] | Pure water | 200 | | | | | | | | | | |
| | | MeOH | | 165 | 190 | 265 | 165 | | | | 265 | | 335 |
| | | DMF | | | | | | 330 | 190 | 190 | | 365 | |
| | RAFT agent [g] | BM1429 | 2.55 | 2.11 | 2.11 | 1.06 | 2.12 | 0.681 | 1.22 | 0.810 | 1.06 | 0.936 | 0.712 |
| | Polymerization rate [%] | | 97 | 90 | 87 | 90 | 89 | 80 | 90 | 90 | 85 | 90 | 95 |
| 2nd | Monomer [g] | AA | | 37.4 | 46.3 | 12.5 | 25.0 | | | | 16.6 | | |
| | | ATBS | 50.2 | 4.20 | | | | 10.6 | 42.7 | 43.0 | | | |
| | | TBAM | | | 1.93 | 4.16 | 16.6 | 3.30 | 4.74 | 4.77 | | | |
| | Initiator [g] | ACVA | 0.072 | 0.056 | | | | | | | | | |
| | | V-65 | | | 0.145 | 0.807 | 0.914 | 0.143 | 0.157 | 0.189 | 0.300 | | |
| | Solvent [g] | Pure water | 200 | 425 | | | | | | | | | |
| | | MeOH | | | 190 | 65 | 165 | | | | 65 | | |
| | | DMF | | | | | | 55 | 190 | 190 | | | |
| | Polymerization rate [%] | | 85 | 85 | 90 | 90 | 92 | 82 | 85 | 85 | 85 | — | — |

The abbreviations of the compounds in Table 3 are as follows.

AA: Acrylic acid

ATBS: 2-Acrylamido-2-methylpropanesulfonic acid

MA: Methyl acrylate

TBAM: N-t-Butylacrylamide

ACVA: 4,4'-Azobis(4-cyanovaleric acid)

V-65: 2,2'-Azobis(2,4-dimethylvaleronitrile)

MeOH: Methanol

DMF: N,N-Dimethylformamide

BM1429: 3-((((1-Carboxyethyl)thio)carbonothioyl)thio) propanoic acid

2. Measurement and Evaluation

Example 1B

As a dispersant, a polymer aqueous solution including polymer A2 at a solid concentration of 20% was provided. 4.0 g of a ceria nanoparticle (primary particle size of 20 nm) and 2 g of the dispersant was added to a 50-mL glass pressure resistant bottle and mixed well, and the pH was adjusted to pH 7 using a 0.5 mol/L HCl solution or a 25% by mass $NH_3$ aqueous solution. Then, 20 g of a zirconia bead having a diameter of 1 mm was added, and the resulting mixture was stirred using a paint shaker for 30 minutes. The bead was removed by filtration and then the remainder was allowed to stand overnight to obtain a slurry-like polishing agent composition.

The following measurement and evaluation were carried out using the obtained polishing agent composition. Results of the measurement and the evaluation are shown in Table 4.

<Slurry Viscosity>

The shear viscosity [mPa·s] of the prepared polishing agent composition was measured under the following conditions.

○Measurement Conditions

Apparatus body: Physical MCR301 manufactured by Anton Paar GmbH

Measurement temperature: 25° C.

Shear rate range: 1 [$s^{-1}$] to 1000 [$s^{-1}$]

It can be deemed that the smaller the value of the slurry viscosity, the less likely the aggregation of the ceria particle due to a shear force to occur and the better the dispersion stability. The particle that had been allowed to stand overnight and settled was redispersed by shaking the container by hand, and the viscosity of the polishing agent composition in the redispersed state was measured.

<Slurry Appearance>

The appearance of the slurry was determined by visually confirming the appearance of the prepared polishing agent composition. First, a slurry-like polishing agent composition was prepared as a reference sample by carrying out the same operation as in Example 1B except that no dispersant was added. This reference sample was left to stand for 24 hours to measure the settling thickness D, and the degree of settling [%] of the particle of each polishing agent composition was calculated with the measured settling thickness D as 100%, to carry out the determination. The determination criteria are as follows. The particle that had been allowed to stand overnight and settled was redispersed by shaking the container by hand, and the particle settling within 1 hour after the redispersion was confirmed.

⊙: Particle settling within 1 hour was 5% or less

○: Particle settling within 1 hour was more than 5% and 15% or less

Δ: Particle settling within 1 hour was more than 15% and 30% or less x: Particle settling within 1 hour was more than 30%

Examples 2B to 9B and Comparative Examples 1B and 2B

Dispersants were each provided in the same manner as in Example 1B except that the polymers used were changed as shown in Table 4, and slurry-like polishing agent compositions were each prepared by the same operations as in Example 1B. The obtained polishing agent compositions were measured for slurry viscosity and evaluated for slurry appearance in the same manner as in Example 1B. Results are shown in Table 4.

34

<<Dispersant>>

The dispersant according to the third embodiment contains, as a water-soluble polymer, a block copolymer (P) having a polymer block A having a structural unit derived from a vinyl monomer represented by the following formula (1) and a polymer block B having a structural unit derived from a vinyl monomer represented by the following formula (1) that is a segment having a monomer composition different from that of the polymer block A.

$$CH_2=CR^1—C(=O)—NR^2—R^3 \qquad (1)$$

wherein $R^1$ is a hydrogen atom or a methyl group, and $R^2$ and $R^3$ are each independently a hydrogen atom or a substituted or unsubstituted monovalent hydrocarbon group, or

TABLE 4

| | | | Polymer block A | | Polymer block B | | A/B mass ratio | | Mn of each block | | Polymer/molecular weight physical properties | | | Slurry | Slurry viscosity |
|---|---|---|---|---|---|---|---|---|---|---|---|---|---|---|---|
| | | Polymer name | Monomer 1 | Monomer 2 | Monomer 1 | Monomer 2 | A | B | A | B | Mn | Mw | PDI | appearance | [mPa · s] |
| Examples | 1B | A2 | AA 50 | — — | ATBS 50 | — — | 50 | 50 | 5000 | 5000 | 9650 | 12500 | 1.3 | ⊚ | 9 |
| | 2B | B2 | AA 40 | TBAM 10 | AA 45 | ATBS 5 | 50 | 50 | 5000 | 5000 | 13600 | 20400 | 1.5 | ⊚ | 9 |
| | 3B | C2 | AA 48 | TBAM 2 | AA 50 | — — | 50 | 50 | 5000 | 5000 | 18900 | 24600 | 1.3 | ⊚ | 11 |
| | 4B | D2 | AA 15 | TBAM 5 | AA 80 | — — | 20 | 80 | 4000 | 16000 | 22500 | 33800 | 1.5 | ⊚ | 12 |
| | 5B | E2 | AA 30 | TBAM 20 | AA 50 | — — | 50 | 50 | 5000 | 5000 | 15200 | 25800 | 1.7 | ⊚ | 14 |
| | 6B | F2 | ATBS 11 | TBAM 3 | AA 86 | — — | 14 | 86 | 5000 | 31000 | 42500 | 72300 | 1.7 | ⊚ | 16 |
| | 7B | G2 | ATBS 45 | TBAM 5 | AA 50 | — — | 50 | 50 | 10000 | 10000 | 24200 | 46000 | 1.9 | ◯ | 19 |
| | 8B | H2 | ATBS 45 | TBAM 5 | ATBS 50 | — — | 50 | 50 | 15000 | 15000 | 30300 | 60600 | 2.0 | ◯ | 19 |
| | 9B | I2 | AA 60 | TBAM 20 | AA 20 | — — | 80 | 20 | 16000 | 4000 | 26300 | 47300 | 1.8 | ◯ | 20 |
| Comparative Examples | 1B | J2 | ATBS 80 | TBAM 20 | — — | — — | 100 | — | 18000 | — | 15800 | 28400 | 1.8 | Δ | 30 |
| | 2B | K2 | AA 70 | MA 30 | — — | — — | 100 | — | 30000 | — | 42000 | 84000 | 2.0 | X | 44 |

In Table 4, the numerical values of monomer 1 and monomer 2 in the "Polymer block A" column and the "Polymer block B" column represent the monomer composition (mass ratio) of each polymer calculated from the amounts of the monomers placed at the time of polymerization. The "A/B Mass ratio" represents the ratio (mass ratio) of the polymer block A and the polymer block B in each polymer calculated from the monomer composition of each polymer. The numerical values in the "Mn of each block" column are design values of Mn of each polymer block A and polymer block B, and the Mn, Mw, and PDI in the "Polymer/molecular weight physical properties" column are measured values by GPC measurement.

As is clear from the results of Examples 1B to 9B, by using the block copolymer (P) having the polymer block A and the polymer block B as the dispersant, a slurry in which the ceria particle was less likely to settle and the ceria particle was stably dispersed in the system was able to be obtained. In addition, it was found that the slurry containing the block copolymer (P) had a low slurry viscosity of 20 mPa·s or less, and that the aggregation of the ceria particle due to a shear force was less likely to occur.

On the other hand, in Comparative Examples 1B and 2B in which the random copolymer was used instead of the block copolymer (P), the degree of settling of the ceria particle was large. In addition, the slurry viscosity was as large as 30 mPa·s and 44 mPa·s, and the result was that the dispersion stability of the ceria particle was inferior.

Third Embodiment

Next, the dispersant and the polishing agent composition of a third embodiment will be described.

$R^2$ and $R^3$ are a group that forms a ring together with a nitrogen atom to which $R^2$ and $R^3$ are attached by being bonded to each other.

<Block Copolymer (P)>

Polymer Block A

The polymer block A has a structural unit derived from a vinyl monomer represented by the above formula (1) (hereinafter, also referred to as the "specific vinyl monomer") (hereinafter, also referred to as a "structural unit UA-3"). The specific vinyl monomer is a vinyl monomer having a primary amide group ($—CONH_2$), a secondary amide group ($—CONHR^2$ or $—CONHR^3$) or a tertiary amide group ($—CONR^2R^3$). In the above formula (1), when $R^2$ and/or $R^3$ is a substituted monovalent hydrocarbon group, examples of the substituted monovalent hydrocarbon group include a group having a secondary amino group, a group having a tertiary amino group, and a hydroxyalkyl group. The group in which $R^2$ and $R^3$ are bonded to each other to form a ring together with a nitrogen atom may further include a hetero atom such as an oxygen atom in addition to the nitrogen atom as an atom constituting the ring.

Examples of the specific vinyl monomer include (meth)acrylamide, a (di)alkyl(meth)acrylamide, a (di)alkylaminoalkylamide, a heterocyclic ring-containing (meth)acrylamide, and a hydroxyl group-containing (meth)acrylamide. Specific examples of these include (meth)acrylamide, a (di)alkyl(meth)acrylamide, and a (di)alkylaminoalkylamide, a heterocyclic ring-containing (meth)acrylamide, and a hydroxyl group-containing (meth)acrylamide, which are given as examples of the amide group-containing vinyl monomer constituting the structural unit UA in the first embodiment described above.

As the specific vinyl monomer constituting the structural unit UA-3, a water-soluble monomer is preferable from the viewpoint of obtaining a polymer having high solubility in an aqueous system. The specific vinyl monomer constituting the structural unit UA-3 is, above all, preferably a vinyl monomer having a primary amide group and/or a hydroxyl group, and particularly preferably at least one selected from the group consisting of (meth)acrylamide and 2-hydroxy-ethylacrylamide. The "water-soluble monomer" refers to a compound having a solubility of 2 g or more in 100 g of water at 20° C.

The polymer block A may be a block consisting only of the structural unit UA-3, and may further have a structural unit derived from a monomer different from the specific vinyl monomer (hereinafter, also referred to as "another monomer M1-3") as long as the action of the block copolymer (P) is not impaired. Another monomer M1-3 is not particularly limited as long as it is a monomer copolymerizable with the specific vinyl monomer. Examples of another monomer M1-3 include an ester group-containing vinyl monomer, an alkyl vinyl ether, a vinyl alcohol, an aromatic vinyl compound, a vinyl ester compound, an α-olefin, an unsaturated acid, and an unsaturated acid anhydride.

As specific examples of another monomer M1-3, examples of the ester group-containing vinyl monomer include a (meth)acrylic acid alkyl ester, an aliphatic cyclic ester of (meth)acrylic acid, an aromatic ester of (meth)acrylic acid, an alkoxyalkyl (meth)acrylate, a hydroxyalkyl (meth)acrylate, a (di)alkylaminoalkyl (meth)acrylate, an epoxy group-containing (meth)acrylic acid ester, and a poly-oxyalkylene (meth)acrylate, which are given as examples of the ester group-containing vinyl monomer constituting the structural unit UA of the polymer block A in the first embodiment described above. In addition, specific examples of the alkyl vinyl ether, the vinyl alcohol, the aromatic vinyl compound, the vinyl ester compound, the α-olefin, the unsaturated acid, and the unsaturated acid anhydride include the alkyl vinyl ether, the vinyl alcohol, the aromatic vinyl compound, the vinyl ester compound, the α-olefin, the unsaturated acid, and the unsaturated acid anhydride, respectively which are given as examples of another monomer M1 that may be used in the production of the polymer block A in the first embodiment described above. As another monomer M1-3, one alone can be used or two or more can be used in combination. Of these, the ester group-containing vinyl monomer is preferable as another monomer M1-3.

The polymer block A may include, together with the structural unit UA-3, a structural unit having an alkyl group having 1 to 10 carbon atoms in a side chain moiety (structural unit UC). The polymer block A that has a structural unit UC is preferable in that the hydrophobicity of the polymer block A is enhanced and that the adsorptivity to an abrasive grain (particularly cerium oxide) can be further improved. The alkyl group which the structural unit UC has in a side chain moiety preferably has 2 or more carbon atoms from the viewpoint of further enhancing the dispersion stability of an abrasive grain. The upper limit of the number of carbon atoms of the alkyl group which the structural unit UC has in a side chain moiety is preferably 8 or less, and more preferably 7 or less, from the viewpoint of obtaining a polymer having high solubility in an aqueous system. The alkyl group is preferably bonded to the main chain via a linking group (—COO—, —CONH—, or the like).

The monomer constituting the structural unit UC is preferably an ester group-containing vinyl monomer, and among such monomers, a (meth)acrylic acid alkyl ester in which the alkyl group of the alkyl ester moiety has 1 to 10 carbon atoms is preferable, and a (meth)acrylic acid alkyl ester in which the alkyl group of the alkyl ester moiety has 2 to 10 carbon atoms is more preferable, in that the effect of improving the dispersion stability of an abrasive grain is high. The polymer block A may have only one structural unit UC, or may have two or more.

In the polymer block A, the content of the structural unit UA-3 is preferably 30% by mass or more based on all the constituent monomer units of the polymer block A. A content of the structural unit UA-3 of 30% by mass or more is preferable in that the dispersion stability of an abrasive grain can be further enhanced. From this viewpoint, the content of the structural unit UA-3 is more preferably 40% by mass or more, further preferably 50% by mass or more, more further preferably 60% by mass or more, and particularly preferably 80% by mass or more, based on all the constituent monomer units of the polymer block A. When a structural unit derived from another monomer is introduced, the upper limit of the content of the structural unit UA-3 is preferably 99% by mass or less, more preferably 97% by mass or less, and further preferably 95% by mass or less, based on all the constituent monomer units of the polymer block A.

When the polymer block A has a structural unit UC, the content of the structural unit UC is preferably 1% by mass or more, more preferably 3% by mass or more, and further preferably 5% by mass or more, based on all the constituent monomer units of the polymer block A from the viewpoint of improving the adsorptivity to an abrasive grain and sufficiently obtaining the effect of improving the dispersion stability of the abrasive grain. The upper limit of the content of the structural unit UC is preferably 50% by mass or less, more preferably 40% by mass or less, and further preferably 20% by mass or less, based on all the constituent monomer units of the polymer block A.

The number average molecular weight (Mn) of the polymer block A is preferably in the range of 1,000 or more and 200,000 or less. An Mn of 1,000 or more is preferable in that the effect of improving the adsorptivity to an abrasive grain by introducing the polymer block A is sufficiently developed.

In addition, an Mn of 200,000 or less is preferable in that the formation of an aggregation structure of an abrasive grain by adsorbing one molecule of the polymer on the surfaces of a plurality of abrasive grains can be sufficiently suppressed. The Mn of the polymer block A is more preferably 1,500 or more, further preferably 2,000 or more, and more further preferably 3,000 or more. In addition, the upper limit of the Mn of the polymer block A is more preferably 150,000 or less, further preferably 100,000 or less, and particularly preferably 70,000 or less. The number average molecular weight (Mn) and the weight average molecular weight (Mw) of the polymer are values in terms of sodium polyacrylate measured by GPC. More specifically, these are values measured by the method described in Examples described later.

Polymer Block B

The polymer block B has a structural unit derived from the specific vinyl monomer (hereinafter, also referred to as a "structural unit UB-3"). Specific examples of the specific vinyl monomer include the vinyl monomer which is given as an example in the description of the structural unit UA-3 of the polymer block A. From the viewpoint of increasing the adsorptivity to an abrasive grain and improving the dispersion stability of the abrasive grain, the structural unit UA-3 and the structural unit UB-3 in one molecule of the polymer are preferably structural units derived from specific vinyl monomers different from each other. When the polymer block A and/or the polymer block B has a plurality of structural units derived from a specific vinyl monomer, at least one of the structural units derived from a specific vinyl monomer which each polymer block has may be different, and all are preferably different.

The specific vinyl monomer constituting the structural unit UB-3 is preferably a water-soluble monomer from the viewpoint of obtaining a polymer having high solubility in an aqueous system, and among such monomers, a vinyl monomer having a secondary amide group and/or a tertiary amide group is preferable. Specifically, the specific vinyl monomer constituting the structural unit UB-3 is preferably at least one selected from the group consisting of N-methyl (meth)acrylamide, N-ethyl(meth)acrylamide, N,N-dimethyl (meth)acrylamide, N,N-diethyl(meth)acrylamide, N-ethyl-N-methyl(meth)acrylamide, 2-hydroxyethylacrylamide, and 4-(meth)acryloylmorpholine. In particular, it is preferable that the structural unit UA-3 have a primary amide group and/or a hydroxyl group and that the structural unit UB-3 have a secondary amide group and/or a tertiary amide group, because the difference in the adsorptivity to an abrasive grain and an object to be polished can be made larger between the segments and the effect of suppressing the formation of an aggregation structure of the abrasive grain due to a shear force can be enhanced.

The polymer block B may be a block consisting only of the structural unit UB-3, and may further have a structural unit derived from a monomer different from the specific vinyl monomer (hereinafter, also referred to as "another monomer M2-3") as long as the action of the block copolymer (P) is not impaired. Another monomer M2-3 is not particularly limited as long as it is a monomer copolymerizable with the specific vinyl monomer. Specific examples of another monomer M2-3 include another monomer M1-3 which is given as an example in the description of the polymer block A.

The polymer block B may include a structural unit having a carboxyl group (hereinafter, also referred to as a "structural unit UD") together with the structural unit UB-3. The polymer block B that has a structural unit UD is preferable in that the dispersion stability of an abrasive grain can be further improved. The monomer constituting the structural unit UD is preferably a vinyl monomer having a carboxyl group, examples thereof include (meth)acrylic acid, crotonic acid, maleic acid, itaconic acid, and fumaric acid, and among these, (meth)acrylic acid is particularly preferable. The carboxyl group of the structural unit UD may form a salt with a counterion such as a sodium ion, a magnesium ion, or a calcium ion. The polymer block B may have only one structural unit UD, or may have two or more.

In the polymer block B, the content of the structural unit UB-3 derived from the specific vinyl monomer is preferably 1% by mass or more based on all the constituent monomer units of the polymer block B. A content of the structural unit UB-3 of 1% by mass or more is preferable in that the dispersion stability of an abrasive grain can be further enhanced. The content of the structural unit UB-3 is more preferably 2% by mass or more, and further preferably 5% by mass or more, based on all the constituent monomer units of the polymer block B. The upper limit of the content of the structural unit UB-3 can be set in the range of 100% by mass or less.

When the polymer block B has a structural unit UD, the content of the structural unit UD is preferably 5% by mass or more, and more preferably 10% by mass or more, based on all the constituent monomer units of the polymer block B from the viewpoint of sufficiently obtaining the effect of improving the dispersion stability of an abrasive grain by introducing the structural unit UD. The upper limit of the content of the structural unit UD is not particularly limited, and is preferably for example 95% by mass or less based on all the constituent monomer units of the polymer block B.

The number average molecular weight (Mn) of the polymer block B is preferably in the range of 1,000 or more and 200,000 or less. An Mn of 1,000 or more is preferable in that the effect of improving the adsorptivity to an abrasive grain by introducing the polymer block B is sufficiently developed. In addition, an Mn of 200,000 or less is preferable in that the formation of an aggregation structure of an abrasive grain by adsorbing one molecule of the polymer on the surfaces of a plurality of abrasive grains can be sufficiently suppressed. The Mn of the polymer block A is more preferably 1,500 or more, further preferably 2,000 or more, and more further preferably 3,000 or more. The upper limit of the Mn of the polymer block B is more preferably 150,000 or less, further preferably 100,000 or less, and particularly preferably 70,000 or less.

<Production of Block Copolymer (P)>

The block copolymer (P) of the present embodiment is not particularly limited in the method for producing the same as long as a block copolymer having two or more different segments can be obtained, and can be produced by adopting a known production method. For a specific description of the method for producing the block copolymer (P), the above description in the first embodiment can be referred to. As a method for producing the block copolymer (P), the living radical polymerization method having a degenerative chain transfer mechanism or a bond-dissociation mechanism is preferable, the RAFT method or the NMP method is more preferable, and the RAFT method is particularly preferable, as in the first embodiment.

The number average molecular weight (Mn) in terms of sodium polyacrylate measured by GPC of the block copolymer (P) of the present embodiment is preferably in the range of 1,000 or more and 150,000 or less. An Mn of 1,000 or more is preferable in that a decrease in the polishing rate can be suppressed while the wettability of the surface of an object to be polished is sufficiently secured. In addition, an Mn of 150,000 or less is preferable in that the aggregation of an abrasive grain due to a shear force can be sufficiently suppressed and that the occurrence of a defect such as a scratch can be sufficiently suppressed during polishing. From these viewpoints, the Mn of the block copolymer (P) is more preferably 1,500 or more, further preferably 2,000 or more, and more further preferably 3,000 or more. The upper limit of the Mn of the block copolymer (P) is more preferably 100,000 or less, further preferably 80,000 or less, more further preferably 70,000 or less, and particularly preferably 50,000 or less.

The weight average molecular weight (Mw) in terms of sodium polyacrylate measured by GPC of the block copolymer (P) is preferably in the range of 1,500 or more and 150,000 or less. The Mw of the block copolymer (P) is more preferably 2,500 or more, and further preferably 3,500 or more. The upper limit of the Mw of the block copolymer (P) is more preferably 100,000 or less, further preferably 80,000 or less, and more further preferably 70,000 or less.

The molecular weight dispersity (PDI=(Mw/Mn)) represented by the ratio of the weight average molecular weight Mw to the number average molecular weight Mn of the block copolymer (P) is preferably 2.2 or less. It is considered that the magnitude of the molecular weight of a polymer exhibiting the dispersion function of an abrasive grain affects the rate of adsorption to/desorption from an object to be polished, and it is generally considered that the smaller the molecular weight of the polymer, the higher the rate of adsorption to/desorption from the object to be polished. In addition, it is considered that a polymer having a large molecular weight is likely to form an aggregation structure of an abrasive grain due to a shear force. Because of this, the polymer used for an application as a dispersant for an abrasive grain preferably has a narrow molecular weight distribution. From these viewpoints, the PDI of the block copolymer (P) is more preferably 2.0 or less, further preferably 1.8 or less, more further preferably 1.5 or less, and particularly preferably 1.3 or less. The lower limit of the PDI is usually 1.0.

The ratio A/B (mass ratio) of the polymer block A and the polymer block B in one molecule of the block copolymer (P) is preferably 5/95 to 95/5, from the viewpoint of suppressing the formation of an aggregation structure of an abrasive grain due to a shear force. The ratio A/B is more preferably 10/90 to 90/10, further preferably 15/85 to 85/15, and more further preferably 20/80 to 80/20. The ratio A/B can be appropriately selected by adjusting the ratio of the monomer used for producing the polymer block A to the monomer used for producing the polymer block B.

As long as the block copolymer (P) has the polymer block A and the polymer block B, the numbers, the arrangement order, and the like of the polymer block A and the polymer block B in one molecule are not particularly limited. For specific examples of a block structure in the block copolymer (P), the description in the first embodiment can be referred to. Of these, the block copolymer (P) of the present embodiment is preferably a diblock copolymer having an AB-type structure in that a block copolymer (P) having sufficiently high dispersion stability of an abrasive grain (particularly cerium oxide) can be efficiently produced.

The dispersant of the present embodiment may be any one containing the block copolymer (P). Therefore, the dispersant may be in a form consisting of a single component containing only the block copolymer (P), or may be in a form including a component different from the block copolymer (P) ("another component") together with the block copolymer (P).

The dispersant of the present embodiment can include a solvent as another component. Examples of the solvent include water, an organic solvent, and a mixed solvent of water and an organic solvent. Of these, the solvent contained in the dispersant is preferably a solvent that can dissolve the block copolymer (P), which is a water-soluble polymer, more preferably a water or a mixed solvent of water and an organic solvent soluble in water, and particularly preferably water. For specific examples of the organic solvent used with water, the above description in the first embodiment can be referred to. As the organic solvent, one alone can be used or two or more can be used in combination.

When the dispersant contains a block copolymer (P) and a solvent, the content of the block copolymer (P) is preferably 1% by mass or more, more preferably 5% by mass or more, and further preferably 10% by mass or more, based on the total mass of the block copolymer (P) and the solvent, from the viewpoint of sufficient contact between the surface of an object to be polished and a polishing pad and the block copolymer (P). In addition, the upper limit of the content of the block copolymer (P) is preferably 70% by mass or less, more preferably 60% by mass or less, and further preferably 50% by mass or less, based on the total mass of the block copolymer (P) and the solvent from the viewpoint of suppressing the deterioration of handleability due to excessively high viscosity.

<<Polishing Agent Composition>>

The polishing agent composition of the present embodiment contains cerium oxide (ceria) as an abrasive grain and the above dispersant. Cerium oxide has the following advantages: a polishing surface can be polished at a higher polishing rate than that in the case of silica, alumina, and the like, and the hardness is lower than that of alumina and the like and the occurrence of a defect on the polishing surface can be suppressed. For the description of cerium oxide used, the content of cerium oxide in the polishing agent composition, the solvent, the method for preparing the polishing agent composition, and the like, the above description in the first embodiment can be referred to.

The polishing agent composition of the present embodiment contains a block copolymer (P) as a dispersant, and thus the dispersion stability of an abrasive grain (particularly a ceria particle) is high, and the effect of suppressing the aggregation of the abrasive grain due to a shear force is high. Therefore, the polishing agent composition of the present embodiment is preferable in that by being used as a polishing liquid for an application flattening the surface of an insulating film, a metal wiring, or both in the production step of a semiconductor element, specifically, for example for flattening an oxide film (a silicon oxide film or the like) during shallow trench isolation (STI) creation, flattening the surface of a metal wiring made of copper, a copper alloy, an aluminum alloy, or the like, or flattening the surface of an interlayer insulating film (oxide film), the occurrence of a defect is reduced and an insulating film and a metal wiring having excellent surface smoothness can be obtained.

Example 3

Hereinafter, the present embodiment will be specifically described with reference to Examples, but the present disclosure is not limited to these Examples. In the following, "parts" and "%" mean "parts by mass" and "% by mass", respectively, unless otherwise specified. The molecular weight of a polymer is a value in terms of sodium polyacrylate measured by GPC using the same conditions as in [Example 1] of the first embodiment described above.

1. Polymer Synthesis

Synthesis Example 1C

In a 4-neck 1-L round-bottom flask equipped with a stirrer, a thermometer, and a nitrogen introduction tube, methanol (165 g), N,N-diethylacrylamide (hereinafter, also referred to as "DEAA") (42.1 g), 2,2'-azobis(2,4-dimethylvaleronitrile) (manufactured by Wako Pure Chemical Industries, Ltd., hereinafter also referred to as "V-65") (0.124 g) as an initiator, 3-((((1-carboxyethyl)thio)carbonothioyl)thio) propanoic acid (manufactured by BORON MOLECULAR, hereinafter also referred to as "BM1429") (1.07 g) as a RAFT agent were placed and sufficiently degassed by nitrogen bubbling, and polymerization was started in a constant temperature bath at 55° C. After 6 hours, the reaction was stopped by cooling with water. Subsequently, methanol (165 g), 2-hydroxyethylacrylamide (hereinafter, also referred to as "HEAA") (37.9 g), n-butyl acrylate (hereinafter, also referred to as "BA") (4.21 g), and V-65 (0.440 g) were placed and sufficiently degassed by nitrogen bubbling, and polymerization was started in a constant temperature bath at 55° C. After 6 hours, the reaction was stopped by cooling with water. Then, the solvent was removed using an evaporator, and the remainder was adjusted to a 20% aqueous solution using pure water. The polymerization rate of DEAA and the polymerization rate of HEAA/BA were each determined from gas chromatography (GC) measurement and found to be 85% and 80%, respectively. The molecular weights of the obtained water-soluble block copolymer (referred to as "polymer A3") were Mn20300 and Mw24400 as measured by GPC, and the PDI was 1.2.

Synthesis Examples 2C and 4C to 6C

The same operation as in Synthesis Example 1C was carried out except that the raw materials to be placed were changed as shown in Table 5, to obtain each of water-soluble block copolymers (polymers B3 and D3 to F3). The results obtained by GPC measurement of the molecular weight of each polymer are shown in Table 6.

Synthesis Example 3C

In a 4-neck 1-L round-bottom flask equipped with a stirrer, a thermometer, and a nitrogen introduction tube, pure water (205 g), 4-acryloylmorpholine (hereinafter, also referred to as "ACMO") (51.1 g), 4,4'-azobis(4-cyanovaleric acid) (hereinafter, also referred to as "ACVA") (0.035 g) as an initiator, and BM1429 (0.52 g) were placed and sufficiently degassed by nitrogen bubbling, and polymerization was started in a constant temperature bath at 70° C. After 4 hours, the reaction was stopped by cooling with water. Subsequently, pure water (205 g), acrylamide (hereinafter, also referred to as "AAm") (51.1 g), and ACVA (0.044 g) were placed and sufficiently degassed by nitrogen bubbling, and polymerization was started in a constant temperature bath at 70° C. After 4 hours, the reaction was stopped by cooling with water. The polymerization rate of ACMO and the polymerization rate of AAm were each determined from GC measurement and found to be 99% and 98%, respectively. The molecular weights of the obtained water-soluble block copolymer (referred to as "polymer C3") were Mn28000 and Mw33600 as measured by GPC, and the PDI was 1.2.

Comparative Synthesis Example 1C

In a 4-neck 1-L round-bottom flask equipped with a stirrer, a thermometer, and a nitrogen introduction tube, pure water (330 g), AAm (51.0 g), AA (51.0 g), ACVA (0.070 g), and BM1429 (1.04 g) were placed and sufficiently degassed by nitrogen bubbling, and polymerization was started in a constant temperature bath at 70° C. After 4 hours, the reaction was stopped by cooling with water. The overall polymerization rate of AAm and AA was determined from GC measurement and found to be 99%. The molecular weights of the obtained random copolymer (referred to as "polymer G3") were Mn9110 and Mw10900 as measured by GPC, and the PDI was 1.2.

Comparative Synthesis Example 2C

The same operation as in Comparative Synthesis Example 1C was carried out except that the raw materials to be placed were changed as shown in Table 5, to obtain polymer H3. The results obtained by GPC measurement of the molecular weights of polymer H3 are shown in Table 6.

Comparative Synthesis Example 3C

The same operation as in Comparative Synthesis Example 3C was carried out except that the raw materials to be placed were changed as shown in Table 5, to obtain polymer 13. The results obtained by GPC measurement of the molecular weights of polymer 13 are shown in Table 6.

TABLE 5

| | | | Synthesis Example 1C | Synthesis Example 2C | Synthesis Example 3C | Synthesis Example 4C | Synthesis Example 5C | Synthesis Example 6C | Comparative Synthesis Example 1C | Comparative Synthesis Example 2C | Comparative Synthesis Example 3C |
|---|---|---|---|---|---|---|---|---|---|---|---|
| | Polymer name | | A3 | B3 | C3 | D3 | E3 | F3 | G3 | H3 | 13 |
| 1st | Monomer [g] | HEAA | | 4.19 | | | | | | | |
| | | DEAA | 42.1 | | | | | | | | |
| | | AAm | | | | | | | 51.0 | 51.1 | 50.6 |
| | | AA | | 37.7 | | | | | 51.0 | 51.1 | |
| | | ACMO | | | 51.1 | 77.8 | 31.7 | 49.1 | | | |
| | Initiator [g] | ACVA | | | 0.035 | | | | 0.070 | 0.070 | 0.035 |
| | | V-65 | 0.124 | 0.109 | | 0.199 | 0.162 | 0.251 | | | |
| | Solvent [g] | Pure water | | | 205 | | | | 330 | 330 | 200 |
| | | MeOH | 165 | | | | | | | | |
| | | DMF | | 165 | | 310 | 125 | 195 | | | |
| | RAFT agent [g] | BM1429 | 1.07 | 2.13 | 0.52 | 1.41 | 2.02 | 2.50 | 1.04 | 1.04 | 0.52 |
| | Polymerization rate [%] | | 85 | 90 | 99 | 89 | 95 | 95 | 99 | 99 | 99 |
| 2nd | Monomer [g] | HEAA | 37.9 | | | | | | | | |
| | | AAm | | 37.7 | 51.1 | 17.5 | 43.6 | 44.2 | | | |
| | | VP | | | | | | | | | 50.6 |
| | | BA | 4.21 | 4.19 | | 1.95 | 3.96 | 4.91 | | | |
| | Initiator [g] | ACVA | | | 0.044 | | | | | | 0.087 |
| | | V-65 | 0.440 | 0.379 | | 0.104 | 0.374 | 0.323 | | | |
| | Solvent [g] | Pure water | | | 205 | | | | | | 200 |
| | | MeOH | 165 | | | | | | | | |
| | | DMF | | 165 | | 80 | 270 | 195 | | | |
| | Polymerization rate [%] | | 80 | 85 | 98 | 92 | 94 | 96 | — | — | 95 |

43      44

The abbreviations of the compounds in Table 5 are as follows.

HEAA: 2-Hydroxyethylacrylamide
DEAA: N,N-Diethylacrylamide
AAm: Acrylamide
AA: Acrylic acid
ACMO: 4-Acryloylmorpholine
ACVA: 4,4'-Azobis(4-cyanovaleric acid)
V-65: 2,2'-Azobis(2,4-dimethylvaleronitrile)
MeOH: Methanol
DMF: N,N-Dimethylformamide
BM1429: 3-((((1-Carboxyethyl)thio)carbonothioyl)thio) propanoic acid
VP: N-Vinyl-2-pyrrolidone
BA: n-Butyl acrylate 2. Measurement and Evaluation

Example 1C

As a dispersant, a polymer aqueous solution including polymer A3 at a solid concentration of 20% was provided. 4.0 g of a ceria nanoparticle (primary particle size of 20 nm) and 2 g of the dispersant was added to a 50-mL glass pressure resistant bottle and mixed well, and the pH was adjusted to pH 7 using a 0.5 mol/L HCl solution or a 25% by mass NH$_3$ aqueous solution. Then, 20 g of a zirconia bead having a diameter of 1 mm was added, and the resulting mixture was stirred using a paint shaker for 30 minutes. The bead was removed by filtration and then the remainder was allowed to stand overnight to obtain a slurry-like polishing agent composition. The following measurement and evaluation were carried out using the obtained polishing agent composition. Results of the measurement and the evaluation are shown in Table 6.

<Slurry Appearance>

The appearance of the slurry was determined by visually confirming the appearance of the prepared polishing agent composition. First, a slurry-like polishing agent composition was prepared as a reference sample by carrying out the same operation as in Example 1C except that no dispersant was added. This reference sample was left to stand for 24 hours to measure the settling thickness D, and the degree of settling [%] of each particle of each polishing agent composition was calculated with the measured settling thickness D as 100%, to carry out the determination. The determination criteria are as follows. The particle that had been allowed to stand overnight and settled was redispersed by shaking the container by hand, and the particle settling within 1 hour after the redispersion was confirmed.

⊙: Particle settling within 1 hour was 5% or less

○: Particle settling within 1 hour was more than 5% and 15% or less

Δ: Particle settling within 1 hour was more than 15% and 30% or less x: Particle settling within 1 hour was more than 30%

Examples 2C to 6C and Comparative Examples 1C to 3C

Dispersants were each provided in the same manner as in Example 1C except that the polymers used were changed as shown in Table 6, and slurry-like polishing agent compositions were each prepared by the same operations as in Example 1C. The obtained polishing agent compositions were measured for slurry viscosity and evaluated for slurry appearance in the same manner as in Example 1C. Results are shown in Table 6.

TABLE 6

| | | | Polymer block A | | Polymer block B | | A/B mass ratio | | Mn of each block | | Polymer/molecular weight physical properties | | | Slurry appear- | Slurry viscosity |
|---|---|---|---|---|---|---|---|---|---|---|---|---|---|---|---|
| | | Polymer name | Monomer 1 | Monomer 2 | Monomer 1 | Monomer 2 | A | B | A | B | Mn | Mw | PDI | ance | [mPa · s] |
| Examples | 1C | A3 | HEAA 45 | BA 5 | DEAA 50 | — — | 50 | 50 | 10000 | 10000 | 20300 | 24400 | 1.2 | ⊙ | 16 |
| | 2C | B3 | AAm 45 | BA 5 | HEAA 5 | AA 45 | 50 | 50 | 5000 | 5000 | 13700 | 17800 | 1.3 | ⊙ | 18 |
| | 3C | C3 | AAm 50 | — — | ACMO 50 | — — | 50 | 50 | 25000 | 25000 | 28000 | 33600 | 1.2 | ⊙ | 22 |
| | 4C | D3 | AAm 18 | BA 2 | ACMO 80 | — — | 20 | 80 | 3500 | 14000 | 10700 | 15000 | 1.4 | ○ | 25 |
| | 5C | E3 | AAm 55 | BA 5 | ACMO 40 | — — | 60 | 40 | 6000 | 4000 | 8900 | 13400 | 1.5 | ○ | 28 |
| | 6C | F3 | AAm 45 | BA 5 | ACMO 50 | — — | 50 | 50 | 5000 | 5000 | 8070 | 12100 | 1.5 | Δ | 35 |
| Comparative Examples | 1C | G3 | AAm 50 | AA 50 | — | — — | 100 | — | 25000 | — | 9110 | 10900 | 1.2 | X | 45 |
| | 2C | H3 | AAm 50 | ACMO 50 | — | — — | 100 | — | 25000 | — | 10800 | 140000 | 1.3 | X | 67 |
| | 3C | I3 | VP 50 | — — | AAm 50 | — — | 50 | 50 | 25000 | 25000 | 56000 | 84000 | 1.5 | Δ | 51 |

<Slurry Viscosity>

The shear viscosity [mPa·s] of the prepared polishing agent composition was measured under the following conditions.

○ Measurement Conditions

Apparatus body: Physical MCR301 manufactured by Anton Paar GmbH

Measurement temperature: 25° C.

Shear rate range: 1 [s$^{-1}$] to 1000 [s$^{-1}$]

It can be deemed that the smaller the value of the slurry viscosity, the less likely the aggregation of the ceria particle due to a shear force to occur and the better the dispersion stability. The particle that had been allowed to stand overnight and settled was redispersed by shaking the container by hand, and the viscosity of the polishing agent composition in the redispersed state was measured.

In Table 6, the numerical values of monomer 1 and monomer 2 in the "Polymer block A" column and the "Polymer block B" column represent the monomer composition (mass ratio) of each polymer calculated from the amounts placed at the time of polymerization. The "A/B Mass ratio" represents the ratio (mass ratio) of the polymer block A and the polymer block B in each polymer calculated from the monomer composition of each polymer. The numerical values in the "Mn of each block" column are theoretically calculated values of Mn of each polymer block A and polymer block B, and the Mn, Mw, and PDI in the "Polymer/molecular weight physical properties" column are measured values by GPC measurement.

As is clear from the results of Examples 1C to 6C, by using the block copolymer (P) having the polymer block A and the polymer block B as the dispersant, a slurry in which the ceria particle was less likely to settle and the ceria particle was stably dispersed in the system was able to be obtained. In addition, it was found that the slurry containing the block copolymer (P) had a low slurry viscosity of 35 mPa·s or less, and that the aggregation of the ceria particle due to a shear force was less likely to occur.

On the other hand, in Comparative Examples 1C and 2C in which the random copolymer was used instead of the block copolymer (P), the degree of settling of the ceria particle was large. In addition, the slurry viscosity was as large as 45 mPa·s and 67 mPa·s, and the dispersion stability of the ceria particle was inferior. Further, in Comparative Example 3C using a block copolymer of N-vinyl-2-pyrrolidone (VP) and acrylamide (AAm), the degree of settling of the ceria particle was rated as "Δ", but the slurry viscosity was as large as 51 mPa·s, and the result was that the dispersion stability of the ceria particle was inferior.

Although the disclosure has been described with respect to only a limited number of embodiments, those skilled in the art, having benefit of this disclosure, will appreciate that various other embodiments may be devised without departing from the scope of the present disclosure. Accordingly, the scope of the invention should be limited only by the attached claims.

What is claimed is:

1. A dispersant for chemical mechanical polishing that flattens a surface of at least one of an insulating layer and a wiring layer, the dispersant comprising:
    a block copolymer (P) having a polymer block A and a polymer block B, wherein
    the polymer block A has a structural unit UA derived from, and has no ionic functional group,
    the polymer block B has a structural unit UB having an ionic functional group selected from the group consisting of a carboxyl group, a sulfonic acid group, a salt of a carboxyl group, and a sulfonic acid group,
    a ratio (A/B) of the polymer block A to the polymer block B in the block copolymer (P) is 5/95 to 95/5 by mass ratio,
    the polymer block B further comprises a structural unit UC having an alkyl group having 1 to 10 carbon atoms in a side chain moiety, and
    a content of the structural unit UC is 1% by mass or more and 50% by mass or less based on all constituent monomer units of the polymer block B.

2. The dispersant according to claim 1, wherein the structural unit UA comprises a structural unit derived from a vinyl monomer represented by formula (1):

$$CH_2=CR^1—C(=O)—NR^2—R^3 \dots (1)$$

where $R^1$ is a hydrogen atom or a methyl group, and $R^2$ and $R^3$ are each independently a hydrogen atom or a substituted or unsubstituted monovalent hydrocarbon group, or $R^2$ and $R^3$ are a group that forms a ring together with a nitrogen atom to which $R^2$ and $R^3$ are attached by being bonded to each other.

3. The dispersant according to claim 1, wherein the ratio (A/B) of the polymer block A to the polymer block B in the block copolymer (P) is 10/90 to 90/10 by mass ratio.

4. The dispersant according to claim 1, wherein a molecular weight dispersity (Mw/Mn) represented by a ratio of the weight average molecular weight Mw to a number average molecular weight Mn of the block copolymer (P) is 2.0 or less.

5. A polishing agent composition for chemical mechanical polishing that flattens a surface of at least one of an insulating layer and a wiring layer, the polishing agent composition comprising:
    the dispersant according to claim 1; and
    cerium oxide.

6. A dispersant for chemical mechanical polishing that flattens a surface of at least one of an insulating layer and a wiring layer, the dispersant comprising:
    a block copolymer (P) having a polymer block A and a polymer block B, wherein
    the polymer block A and the polymer block B each have a structural unit having an ionic functional group selected from the group consisting of a carboxyl group, a sulfonic acid group, and a salt thereof,
    the block copolymer (P) is a polymer that satisfies at least one of condition I and condition II:
        condition I: the ionic functional group of the polymer block A and the ionic functional group of the polymer block B are different from each other, and
        condition II: a content of the ionic functional group of the polymer block A and a content of the ionic functional group of the polymer block B are different from each other, and
    a ratio (A/B) of the polymer block A to the polymer block B in the block copolymer (P) is 5/95 to 95/5 by mass ratio,
    wherein the polymer block A further comprises a structural unit UC having an alkyl group having 1 to 10 carbon atoms in a side chain moiety, in addition to the structural unit having the ionic functional group, and
    a content of the structural unit UC is 1% by mass or more and 70% by mass or less based on all constituent monomer units of the polymer block A.

7. The dispersant according to claim 6, wherein the ratio (A/B) of the polymer block A to the polymer block B in the block copolymer (P) is 10/90 to 90/10 by mass ratio.

8. The dispersant according to claim 6, wherein the polymer block B further comprises a structural unit having an alkyl group having 1 to 10 carbon atoms in a side chain moiety.

9. The dispersant according to claim 6, wherein a molecular weight dispersity (Mw/Mn) represented by a ratio of the weight average molecular weight Mw to a number average molecular weight Mn of the block copolymer (P) is 2.0 or less.

10. A polishing agent composition for chemical mechanical polishing that flattens a surface of at least one of an insulating layer and a wiring layer, the polishing agent composition comprising:
    the dispersant according to claim 6; and
    cerium oxide.

11. A dispersant for chemical mechanical polishing that flattens a surface of at least one of an insulating layer and a wiring layer, the dispersant comprising:
    a block copolymer (P) having a polymer block A and a polymer block B, wherein
    the polymer block A and the polymer block B each have a structural unit derived from a vinyl monomer represented by formula (1):

$$CH_2=CR^1—C(=O)—NR^2—R^3 \dots (1)$$

where $R^1$ is a hydrogen atom or a methyl group, and $R^2$ and $R^3$ are each independently a hydrogen atom or a substituted or unsubstituted monovalent hydrocarbon group, or $R^2$ and $R^3$ are a group that forms a ring together with a nitrogen atom to which $R^2$ and $R^3$ are attached by being bonded to each other, and the vinyl monomer represented by the formula (1) is at least one selected from the group consisting of (meth)acrylamide, N-methyl(meth)acrylamide, N-ethyl(meth)acrylamide, N,N-dimethyl(meth)acrylamide, N,N-diethyl(meth)acrylamide, N-ethyl-N-methyl(meth)acrylamide, 4-(meth)acryloylmorpholine, 2-hydroxyethylacrylamide, and 2-(meth)acrylamido-2-methylpropanesulfonic acid or a salt thereof, and a ratio (A/B) of the polymer block A to the polymer block B in the block copolymer (P) is 5/95 to 95/5 by mass ratio.

12. The dispersant according to claim 11, wherein the polymer block A comprises a structural unit having at least one of a primary amide group and a hydroxyl group as the structural unit derived from a vinyl monomer represented by the formula (1).

13. The dispersant according to claim 11, wherein the polymer block B comprises a structural unit having at least one of a secondary amide group and a tertiary amide group as the structural unit derived from a vinyl monomer represented by the formula (1).

14. The dispersant according to claim 11, wherein the polymer block B comprises a structural unit having a carboxyl group.

15. The dispersant according to claim 11, wherein the ratio (A/B) of the polymer block A to the polymer block B in the block copolymer (P) is 10/90 to 90/10 by mass ratio.

16. The dispersant according to claim 11, wherein the polymer block B further comprises a structural unit having an alkyl group having 1 to 10 carbon atoms in a side chain moiety.

17. The dispersant according to claim 11, wherein a molecular weight dispersity (Mw/Mn) represented by a ratio of the weight average molecular weight Mw to a number average molecular weight Mn of the block copolymer (P) is 2.0 or less.

18. A polishing agent composition for chemical mechanical polishing that flattens a surface of at least one of an insulating layer and a wiring layer, the polishing agent composition comprising:

the dispersant according to claim 11; and cerium oxide.

* * * * *